(12) United States Patent
Kim et al.

(10) Patent No.: US 11,956,967 B2
(45) Date of Patent: Apr. 9, 2024

(54) INTEGRATED CIRCUIT DEVICE AND METHOD OF MANUFACTURING THE SAME

(71) Applicant: SAMSUNG ELECTRONICS CO., LTD., Suwon-si (KR)

(72) Inventors: Sunggil Kim, Yongin-si (KR); Kyengmun Kang, Hwaseong-si (KR); Hyeeun Hong, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 379 days.

(21) Appl. No.: 17/222,403

(22) Filed: Apr. 5, 2021

(65) Prior Publication Data

US 2021/0408028 A1    Dec. 30, 2021

(30) Foreign Application Priority Data

Jun. 24, 2020    (KR) .................... 10-2020-0077382

(51) Int. Cl.
| | |
|---|---|
| *H10B 43/40* | (2023.01) |
| *H10B 41/10* | (2023.01) |
| *H10B 41/27* | (2023.01) |
| *H10B 41/35* | (2023.01) |
| *H10B 41/40* | (2023.01) |

(Continued)

(52) U.S. Cl.
CPC ............. *H10B 43/40* (2023.02); *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02)

(58) Field of Classification Search
CPC ........ H10B 43/40; H10B 41/10; H10B 43/35; H10B 41/35; H10B 41/40; H10B 43/10; H10B 41/27; H10B 43/27; H01L 27/11573; H01L 27/11519; H01L 27/1157; H01L 27/11524; H01L 27/11526;

(Continued)

(56) References Cited

U.S. PATENT DOCUMENTS

| | | |
|---|---|---|
| 7,679,133 B2 | 3/2010 | Son et al. |
| 8,553,466 B2 | 10/2013 | Han et al. |

(Continued)

FOREIGN PATENT DOCUMENTS

| | | |
|---|---|---|
| KR | 10-1778287 | 9/2017 |
| KR | 10-2020-0005922 | 1/2020 |

*Primary Examiner* — David Vu
(74) *Attorney, Agent, or Firm* — F. Chau & Associates, LLC

(57) ABSTRACT

An integrated circuit device includes a peripheral circuit structure arranged on a substrate, a gate stack arranged on the peripheral circuit structure and including a plurality of gate electrodes, and a dam structure formed in a dam opening portion that passes through the gate stack. The dam structure includes an insulation spacer on an inner wall of the dam opening portion and a pair of sloped sidewalls at an upper side of the dam opening portion, and a buried layer filling an inside of the dam opening portion and including an air space. The integrated circuit device further includes a mold gate stack surrounded by the dam structure and including a plurality of mold layers, a plurality of conductive lines arranged on the gate stack, and a plurality of through electrodes connected to the plurality of conductive lines, passing through the mold gate stack, and surrounded by the dam structure.

20 Claims, 37 Drawing Sheets

(51) Int. Cl.
*H10B 43/10* (2023.01)
*H10B 43/27* (2023.01)
*H10B 43/35* (2023.01)

(58) Field of Classification Search
CPC ......... H01L 27/11565; H01L 27/11556; H01L 27/11582
See application file for complete search history.

(56) References Cited

U.S. PATENT DOCUMENTS

| | | |
|---|---|---|
| 8,559,235 B2 | 10/2013 | Yoon et al. |
| 8,654,587 B2 | 2/2014 | Yoon et al. |
| 8,658,499 B2 | 2/2014 | Makala et al. |
| 8,822,322 B2 | 9/2014 | Lee et al. |
| 9,324,731 B1 | 4/2016 | Lai |
| 10,290,649 B2 | 5/2019 | Matsuno |
| 10,475,879 B1 | 11/2019 | Pachamuthu et al. |
| 10,790,299 B2 | 9/2020 | Shim |
| 2011/0233648 A1 | 9/2011 | Seol et al. |
| 2015/0311209 A1 | 10/2015 | Whang et al. |
| 2019/0355740 A1 | 11/2019 | Hong et al. |
| 2020/0227318 A1* | 7/2020 | Kawasaki ......... H01L 21/76849 |
| 2021/0210424 A1* | 7/2021 | Otsu ..................... H10B 43/35 |

* cited by examiner

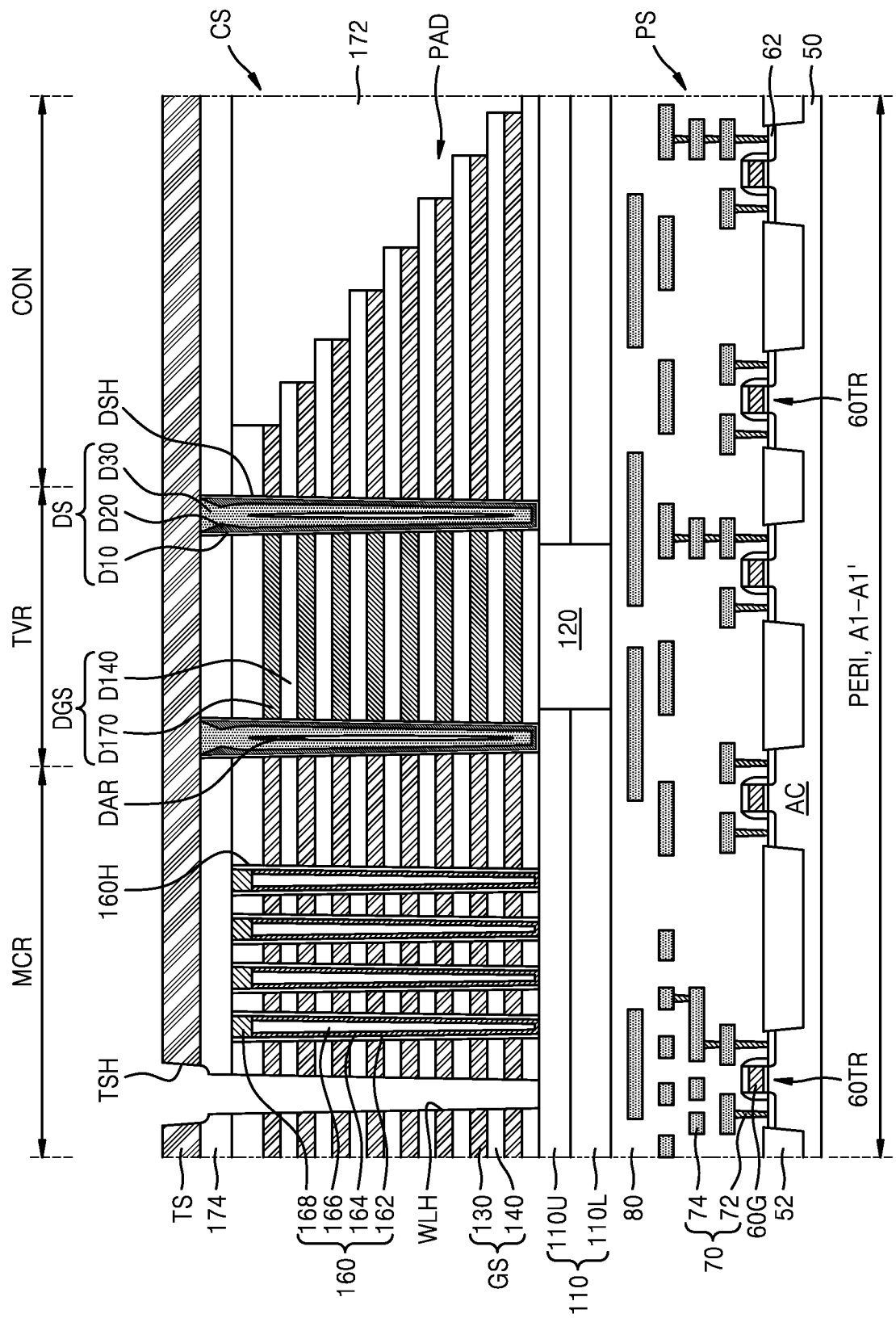

INTEGRATED CIRCUIT DEVICE AND METHOD OF MANUFACTURING THE SAME

CROSS-REFERENCE TO RELATED APPLICATION

This application claims priority under 35 U.S.C. § 119 to Korean Patent Application No. 10-2020-0077382, filed on Jun. 24, 2020 in the Korean Intellectual Property Office, the disclosure of which is incorporated by reference herein in its entirety.

TECHNICAL FIELD

Exemplary embodiments of the inventive concept relate to an integrated circuit device and a method of manufacturing the same, and more particularly, to an integrated circuit device including a channel structure extending in a vertical direction and a method of manufacturing the same.

DISCUSSION OF RELATED ART

As the integration of memory devices increases, a memory device having a vertical transistor structure has been proposed in place of a memory device having an existing planar transistor structure. A memory device having a vertical transistor structure includes a channel structure extending in a vertical direction on a substrate. As the integration of memory devices increases, the number of gate electrode layers stacked in the vertical direction increases.

SUMMARY

Exemplary embodiments of the inventive concept provide an integrated circuit device that may prevent or reduce a process defect caused by bending of a memory stack in spite of having a high vertical height.

Exemplary embodiments of the inventive concept also provide a method of manufacturing an integrated circuit device that may prevent or reduce a process defect caused by bending of a memory stack in spite of having a high vertical height.

According to an exemplary embodiment of the inventive concept, an integrated circuit device includes a peripheral circuit structure arranged on a substrate, a gate stack arranged on the peripheral circuit structure and including a plurality of gate electrodes spaced in a first direction substantially perpendicular to a top surface of the substrate, and a dam structure formed in a dam opening portion that passes through the gate stack. The dam structure includes an insulation spacer, which is arranged on an inner wall of the dam opening portion and includes a pair of sloped sidewalls at an upper side of the dam opening portion, and a buried layer, which fills an inside of the dam opening portion and includes an air space. The integrated circuit device further includes a mold gate stack which is surrounded by the dam structure and includes a plurality of mold layers spaced apart in the first direction, a plurality of conductive lines arranged on the gate stack, the mold gate stack, and the dam structure, and a plurality of through electrodes which is connected to the plurality of conductive lines, extends to the peripheral circuit structure through the mold gate stack, and is surrounded by the dam structure.

According to an exemplary embodiment of the inventive concept, an integrated circuit device includes a peripheral circuit structure arranged on a substrate, and a gate stack arranged on the peripheral circuit structure. The gate stack includes a plurality of gate electrodes spaced apart in a first direction substantially perpendicular to a top surface of the substrate, and a gate stack separation opening portion extending in a second direction that is substantially parallel to the top surface of the substrate. The integrated circuit device further includes a dam structure formed in a dam opening portion that passes through the gate stack. The dam structure includes an insulation spacer, which is arranged on an inner wall of the dam opening portion and includes a pair of sloped sidewalls at an upper side of the dam opening portion, and a buried layer, which fills an inside of the dam opening portion and includes an air space. The dam opening portion is spaced apart from the gate stack separation opening portion. The integrated circuit device further includes a mold gate stack which is surrounded by the dam structure and includes a plurality of mold layers spaced apart in the first direction, an upper support layer that is arranged on the gate stack and includes a plurality of opening portions vertically overlapping the gate stack separation opening portion, a plurality of conductive lines arranged on the upper support layer, and a plurality of through electrodes which are connected to the plurality of conductive lines, extend to the peripheral circuit structure through the mold gate stack, and are surrounded by the dam structure.

According to an exemplary embodiment of the inventive concept, an integrated circuit device includes a peripheral circuit structure arranged on a substrate, and a cell array structure arranged on the peripheral circuit structure. The cell array structure includes a gate stack, which includes a plurality of gate electrodes spaced apart in a first direction substantially perpendicular to a top surface of the substrate and a gate stack separation opening portion extending in a second direction that is substantially parallel to the top surface of the substrate, and a dam structure formed in a dam opening portion that passes through the gate stack. The dam structure includes an insulation liner, which is arranged on an inner wall of the dam opening portion, an insulation spacer, which is arranged on an inner wall of the dam opening portion and includes a pair of sloped sidewalls at an upper side of the dam opening portion, and a buried layer, which fills an inside of the dam opening portion and includes an air space. The dam opening portion is spaced apart from the gate stack separation opening portion. The cell array structure further includes a mold gate stack which is surrounded by the dam structure and includes a plurality of insulation layers and a plurality of mold layers which are arranged alternately in the first direction, and an upper support layer that is arranged on the gate stack and includes a plurality of opening portions vertically overlapping the gate stack separation opening portion. The integrated circuit device further includes a plurality of conductive lines arranged on the cell array structure, and a plurality of through electrodes which are connected to the plurality of conductive lines, extend to the peripheral circuit structure through the cell array structure, and are surrounded by the dam structure, in which the air space is arranged at a lower vertical level than a level of the pair of sloped sidewalls.

According to an exemplary embodiment of the inventive concept, a method of manufacturing an integrated circuit device includes forming a peripheral circuit structure on a substrate, forming a mold gate stack including a plurality of mold layers and a plurality of insulation layers alternately arranged on the peripheral circuit structure, forming a gate stack separation opening portion by patterning the mold gate stack, forming a sacrificial insulation spacer including a pair of sloped sidewalls at an upper side of the gate stack separation opening portion on an inner wall of the gate stack separation opening portion, forming a sacrificial buried layer which fills an inside of the gate stack separation opening portion and includes an air space therein, forming an upper support layer including an opening portion that vertically overlaps the gate stack separation opening portion on the mold gate stack, removing the sacrificial insulation spacer and the sacrificial buried layer inside the gate stack separation opening portion exposed to the opening portion, and replacing the plurality of mold layers exposed to the inside of the gate stack separation opening portion through the opening portion with a plurality of gate electrodes.

According to an exemplary embodiment of the inventive concept, a method of manufacturing an integrated circuit device includes forming a peripheral circuit structure on a substrate, forming a mold gate stack including a plurality of mold layers and a plurality of insulation layers alternately arranged on the peripheral circuit structure, forming a gate stack separation opening portion and a dam opening portion, which is apart from the gate stack separation opening portion, by patterning the mold gate stack, forming a sacrificial insulation spacer including a pair of sloped sidewalls at an upper side of the gate stack separation opening portion on an inner wall of the gate stack separation opening portion and a pair of sloped sidewalls at an upper side of the dam opening portion on the inner wall of the dam opening portion, forming a sacrificial buried layer which fills an inside of the gate stack separation opening portion and includes an air space therein, and a buried layer which fills an inside of the dam opening portion and includes an air space therein, forming an upper support layer including an opening portion that vertically overlaps the gate stack separation opening portion on the mold gate stack, removing the sacrificial insulation spacer and the sacrificial buried layer inside the gate stack separation opening portion exposed to the opening portion, and replacing the plurality of mold layers exposed to the inside of the gate stack separation opening portion through the opening portion with a plurality of gate electrodes.

BRIEF DESCRIPTION OF THE DRAWINGS

The above and other features of the inventive concept will become more apparent by describing in detail exemplary embodiments thereof with reference to the accompanying drawings, in which:

FIGS. 14A through 24B are schematic views showing a method of manufacturing an integrated circuit device according to exemplary embodiments of the inventive concept in a processing order, in which, FIGS. 14A, 15A, 16A, 17A, 20A, 21A, 22A, 23A, and 24A are plan views shown in a processing order, FIGS. 14B, 15B, 16B, 17B, 18A, 19A, 20B, 21B, 22B, 23B, and 24B are cross-sectional views taken along line A1-A1' of FIGS. 14A, 15A, 16A, 17A, 20A, 21A, 22A, 23A, and 24A, and FIGS. 18B, 19B, 20C, and 21C are exploded cross-sectional views of region CXB of FIGS. 18A, 19A, 20B, and 21B.

DETAILED DESCRIPTION OF THE EXEMPLARY EMBODIMENTS

Figure 1:
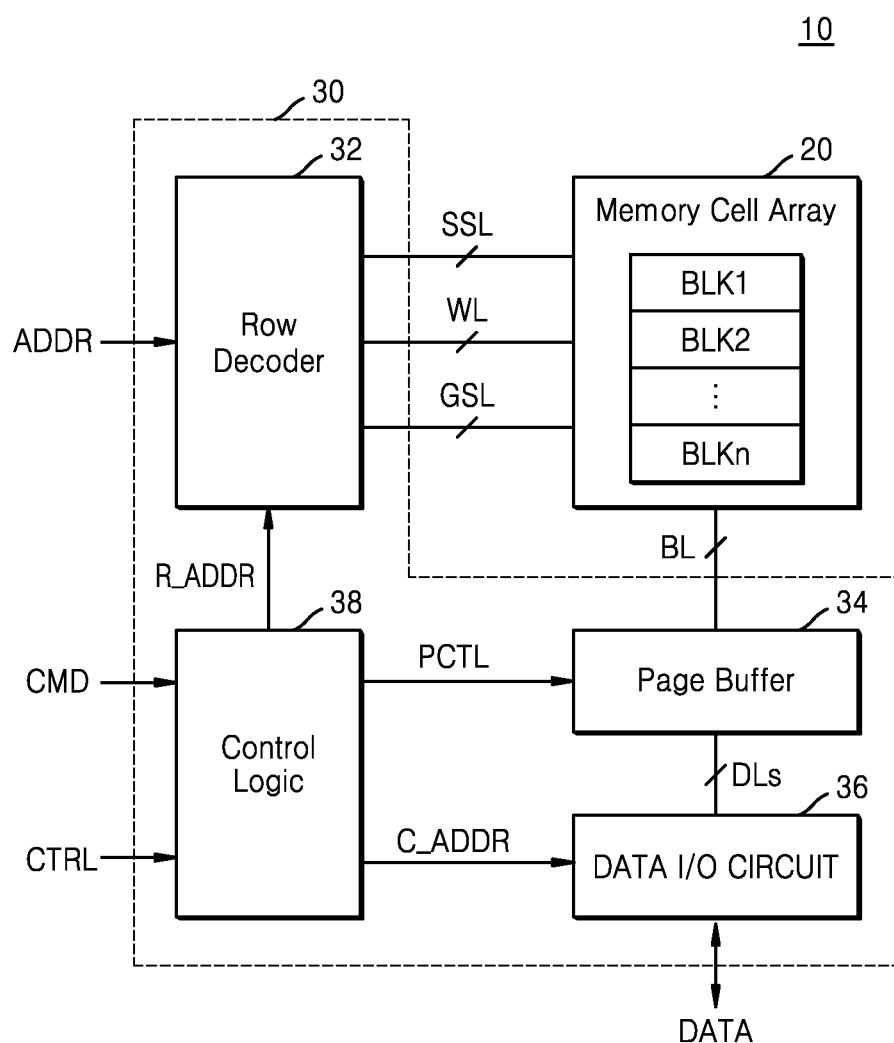
FIG. 1 is a block diagram of an integrated circuit device according to exemplary embodiments of the inventive concept.

Exemplary embodiments of the inventive concept will be described more fully hereinafter with reference to the accompanying drawings. Like reference numerals may refer to like elements throughout the accompanying drawings.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It should be understood that when a component such as a film, a region, a layer, or an element, is referred to as being "on", "connected to", "coupled to", or "adjacent to" another component, it can be directly on, connected, coupled, or adjacent to the other component, or intervening components may be present. It should also be understood that when a component is referred to as being "between" two components, it can be the only component between the two components, or one or more intervening components may also be present. It should also be understood that when a component is referred to as "covering" another component, it can be the only component covering the other component, or one or more intervening components may also be covering the other component. Other words used to describe the relationships between components should be interpreted in a like fashion.

It should be further understood that the terms "first," "second," "third," etc. are used herein to distinguish one element from another, and the elements are not limited by these terms. Thus, a "first" element in an exemplary embodiment may be described as a "second" element in another exemplary embodiment.

It should be further understood that descriptions of features or aspects within each exemplary embodiment should typically be considered as available for other similar features or aspects in other exemplary embodiments, unless the context clearly indicates otherwise.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Other words used to describe the relationships between components should be interpreted in a like fashion.

Further, when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art. Similarly, when elements are described as being substantially coplanar with one another, it is to be understood that elements are exactly coplanar with one another, or almost coplanar with one another (e.g., within a measurement error), as would be understood by a person having ordinary skill in the art. In addition, when two or more processes or events are described as being performed at or occurring at substantially the same time, it is to be understood that the processes or events may be performed at or may occur at exactly the same time, or at about the same time as would be understood by a person having ordinary skill in the art. For example, the processes or events may be performed at or may occur at about the same time within a measurement error as would be understood by a person having ordinary skill in the art. Other words used to describe the relationships between components should be interpreted in a like fashion.

FIG. 1 is a block diagram of an integrated circuit device 10 according to exemplary embodiments of the inventive concept.

Referring to FIG. 1, the integrated circuit device 10 may include a memory cell array 20 and a peripheral circuit 30. The memory cell array 20 may include a plurality of memory cell blocks BLK1, BLK2, . . . , BLKn, in which n is a positive integer. Each of the plurality of memory cell blocks BLK1, BLK2, . . . , BLKn may include a plurality of memory cells. The memory cell blocks BLK1, BLK2, . . . , BLKn may be connected to the peripheral circuit 30 through word lines WL, string selection lines SSL, and ground selection lines GSL.

The peripheral circuit 30 may include a row decoder 32, a page buffer 34, a data input/output circuit 36, and a control logic 38. The peripheral circuit 30 may further include an input/output interface, a column logic, a voltage generator, a pre-decoder, a temperature sensor, a command decoder, an address decoder, an amplification circuit, etc.

The memory cell array 20 may be connected to the page buffer 34 through the bit line BL, and may be connected to the row decoder 32 through the word line WL, the string selection line SSL, and the ground selection line GSL. In the memory cell array 20, a plurality of memory cells included in each of the plurality of memory cell blocks BLK1, BLK2, . . . , BLKn may be flash memory cells. The memory cell array 20 may include a three-dimensional (3D) memory cell array. The 3D memory cell array may include a plurality of NAND strings, each of which may include a plurality of memory cells connected to a plurality of word lines WL stacked vertically on a substrate.

The peripheral circuit 30 may receive an address ADDR, a command CMD, and a control signal CTRL from a source external to the integrated circuit device 10, and may transmit and receive data to and from a device external to the integrated circuit device 10.

The row decoder 32 may select at least one of the plurality of memory cell blocks BLK1, BLK2, . . . , BLKn in response to the address ADDR received from the outside, and may select the word line WL, the string selection line SSL, and the ground selection line GSL of the selected memory cell block. The row decoder 32 may deliver a voltage for performing a memory operation to the word line WL of the selected memory cell block.

The page buffer 34 may be connected to the memory cell array 20 through the bit line BL. The page buffer 34 may operate as a write driver in a program operation to apply a voltage corresponding to data DATA to be stored in the memory cell array 20 to the bit line BL, and may operate as a sense amplifier to sense the data DATA stored in the memory cell array 20. The page buffer 34 may operate according to a control signal PCTL provided from the control logic 38.

The data input/output circuit 36 may be connected to the page buffer 34 through data lines DLs. In the program operation, the data input/output circuit 36 may receive the data DATA from a memory controller and may provide program data DATA to the page buffer 34 based on a column address C_ADDR provided from the control logic 38. In the read operation, the data input/output circuit 36 may provide read data DATA stored in the page buffer 34 to the memory controller based on the column address C_ADDR provided from the control logic 38.

The data input/output circuit 36 may transmit an input address or command to the control logic 38 or the row decoder 32. The peripheral circuit 30 may further include an electrostatic discharge (ESD) circuit and a pull-up/pull-down driver.

The control logic 38 may receive the command CMD and the control signal CTRL from the memory controller. The control logic 38 may provide a row address R_ADDR to the row decoder 32 and may provide the column address C_ADDR to the data input/output circuit 36. The control logic 38 may generate various internal control signals used in the integrated circuit device 10 in response to the control signal CTRL. For example, the control logic 38 may adjust a voltage level provided to the word line WL and the bit line BL when a memory operation such as a program operation or an erase operation is performed.

Figure 2:
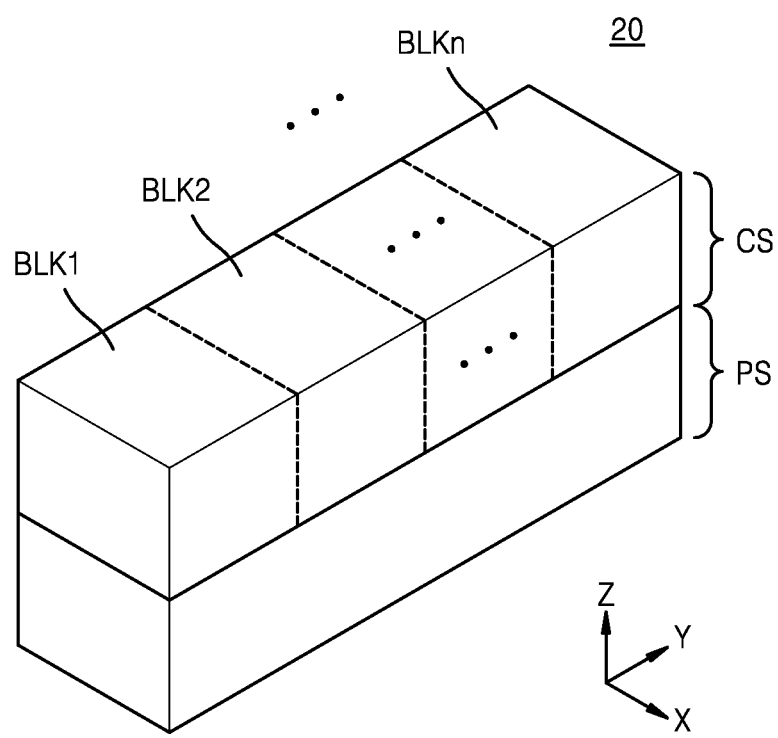
FIG. 2 is a schematic perspective view of an integrated circuit device according to exemplary embodiments of the inventive concept.

FIG. 2 is a schematic perspective view of the integrated circuit device 10 according to exemplary embodiments of the inventive concept.

Referring to FIG. 2, the integrated circuit device 10 may include a cell array structure CS and a peripheral circuit structure PS, which overlap each other in a vertical direction Z. The cell array structure CS may include the memory cell array 20 described with reference to FIG. 1. The peripheral circuit structure PS may include the peripheral circuit 30 described with reference to FIG. 1.

The cell array structure CS may include a plurality of memory cell blocks BLK1, BLK2, . . . , BLKn, in which n is a positive integer. Each of the plurality of memory cell blocks BLK1, BLK2, . . . , BLKn may include memory cells arranged three-dimensionally.

Figure 3:
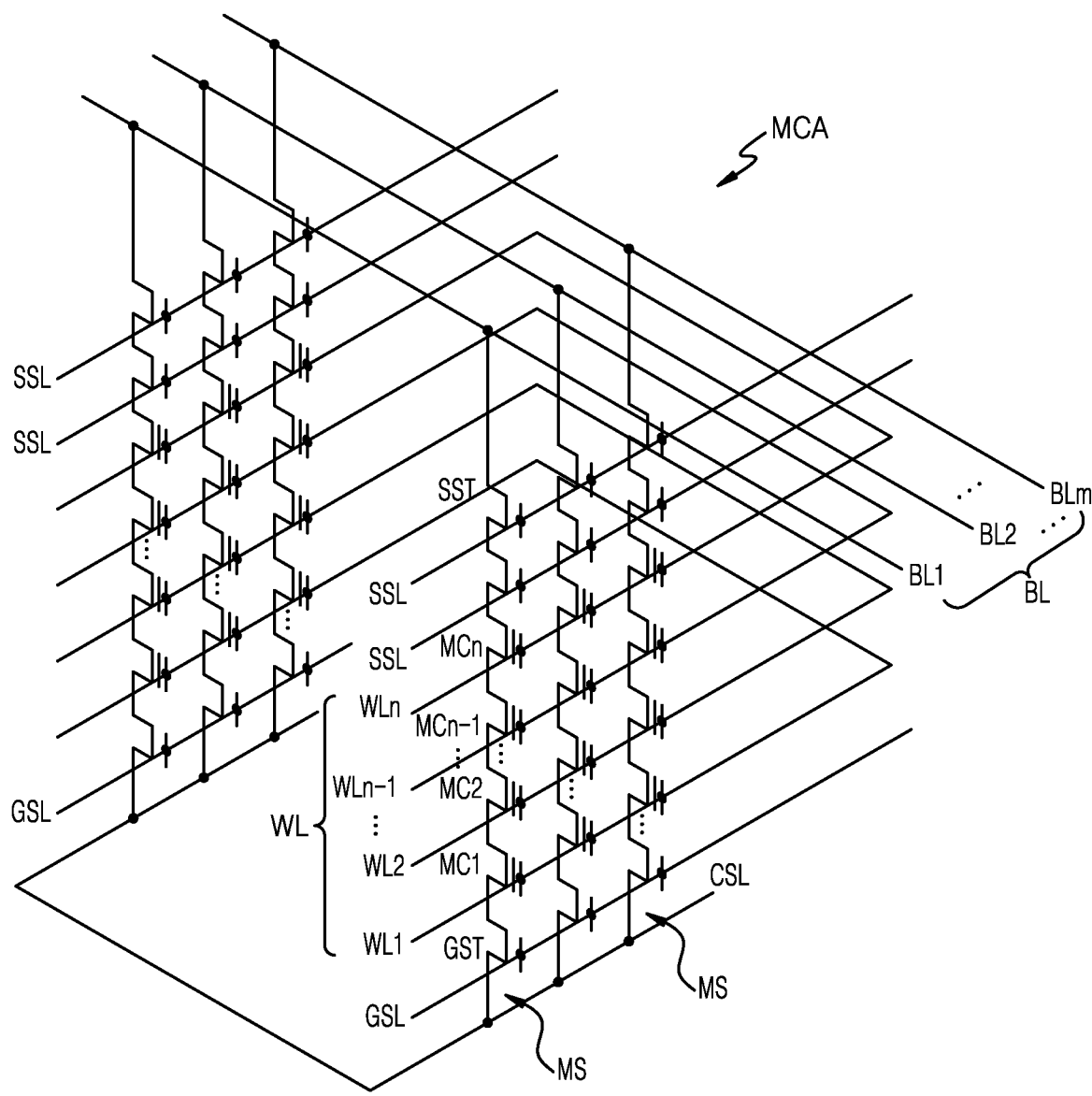
FIG. 3 is an equivalent circuit diagram of a memory cell array of an integrated circuit device according to exemplary embodiments of the inventive concept.

FIG. 3 is an equivalent circuit diagram of a memory cell array of the integrated circuit device 10 according to exemplary embodiments of the inventive concept.

Referring to FIG. 3, a memory cell array MCA may include a plurality of memory cell strings MS. The memory cell array MCA may include a plurality of bit lines BL (BL1, BL2, . . . , BLm), a plurality of word lines WL (WL1, WL2, . . . , WLn-1, WLn), at least one string selection line SSL, at least one ground selection line GSL, and a common source line CSL, in which m and n are positive integers. The plurality of memory cell strings MS may be formed between the plurality of bit lines BL (BL1, BL2, . . . , BLm) and the common source line CSL. Although FIG. 3 shows a case in which each of the plurality of memory cell strings MS includes two string selection lines SSL, the inventive concept is not limited thereto. For example, according to exemplary embodiments, each of the plurality of memory cell strings MS may include one string selection line SSL.

Each of the plurality of memory cell strings MS may include a string selection transistor SST, a ground selection transistor GST, and a plurality of memory cell transistors MC1, MC2, . . . , MCn-1, MCn. A drain region of the string selection transistor SST may be connected to the bit line BL (BL1, BL2, . . . , BLm), and a source region of the ground selection transistor GST may be connected to the common source line CSL. The common source line CSL may be a region to which source regions of the plurality of ground selection transistors GST are commonly connected.

The string selection transistor SST may be connected to the string selection line SSL, and the ground selection transistor GST may be connected to the ground selection line GSL. The plurality of memory cell transistors MC1, MC2, . . . , MCn-1, MCn may be connected to the plurality of word lines WL (WL1, WL2, . . . , WLn-1, WLn), respectively.

Figure 4:
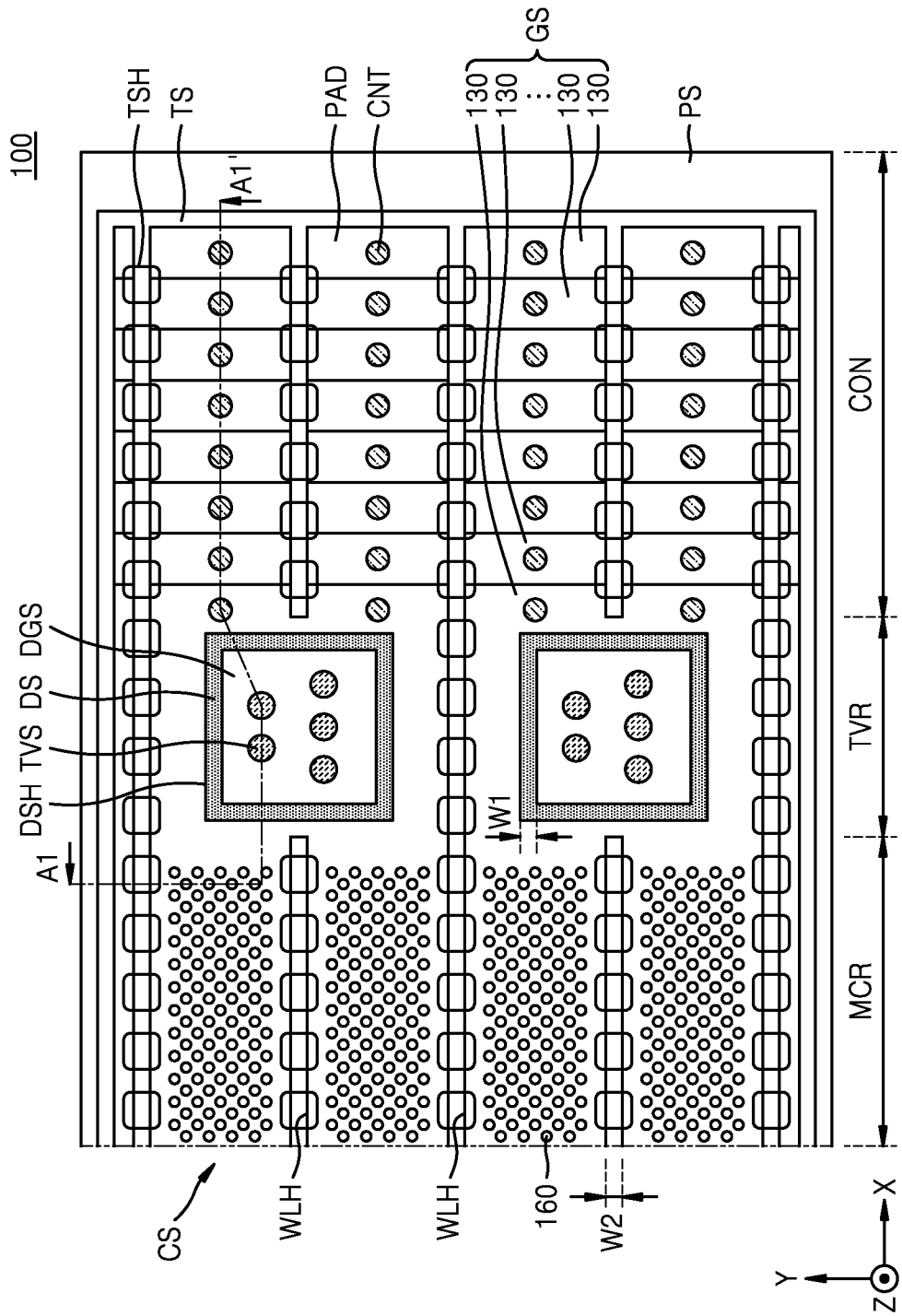
FIG. 4 is a plan view showing a representative structure of an integrated circuit device according to exemplary embodiments of the inventive concept.
Figure 5:
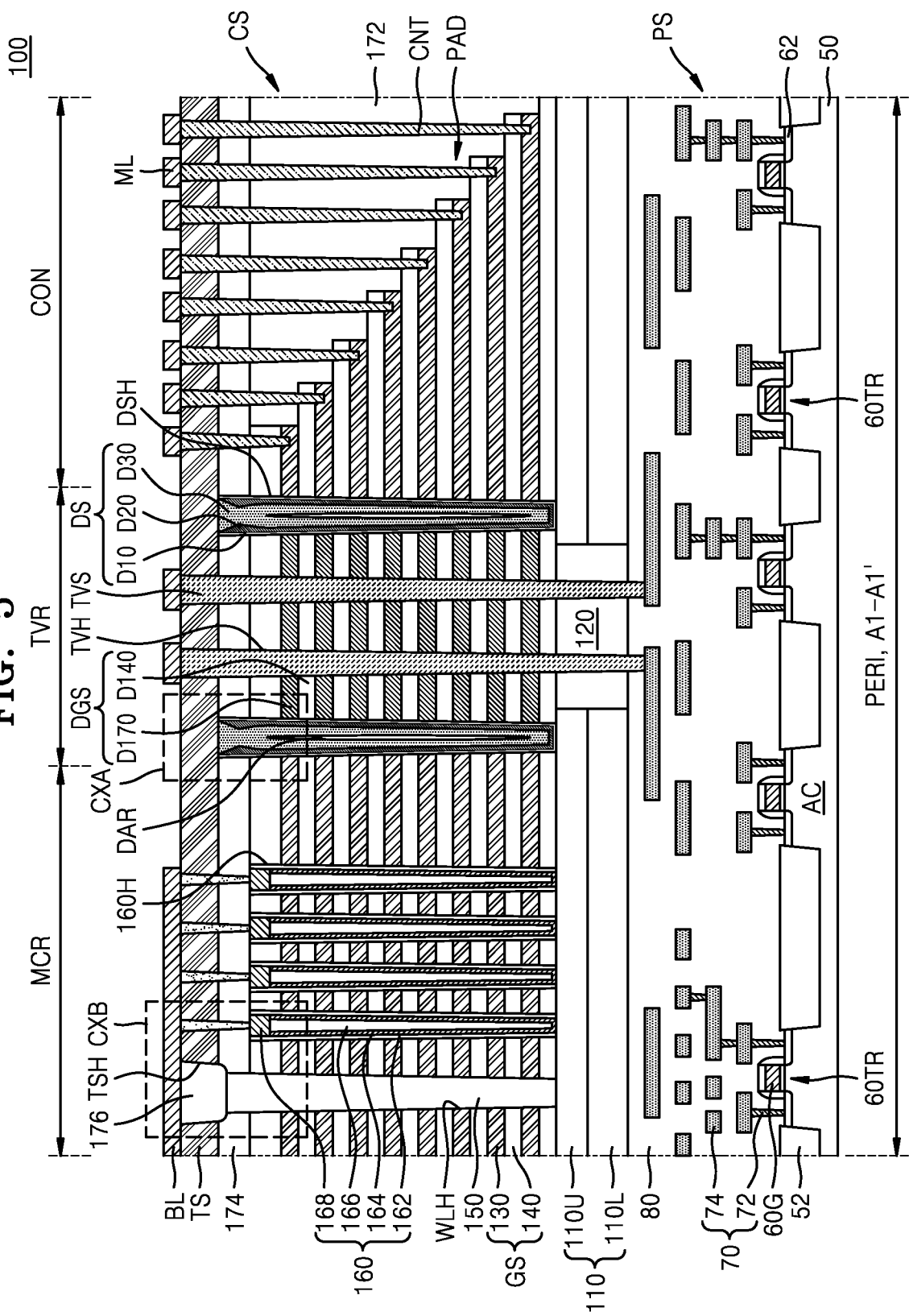
FIG. 5 is a cross-sectional view taken along line A1-A1' of FIG. 4.
Figure 6:
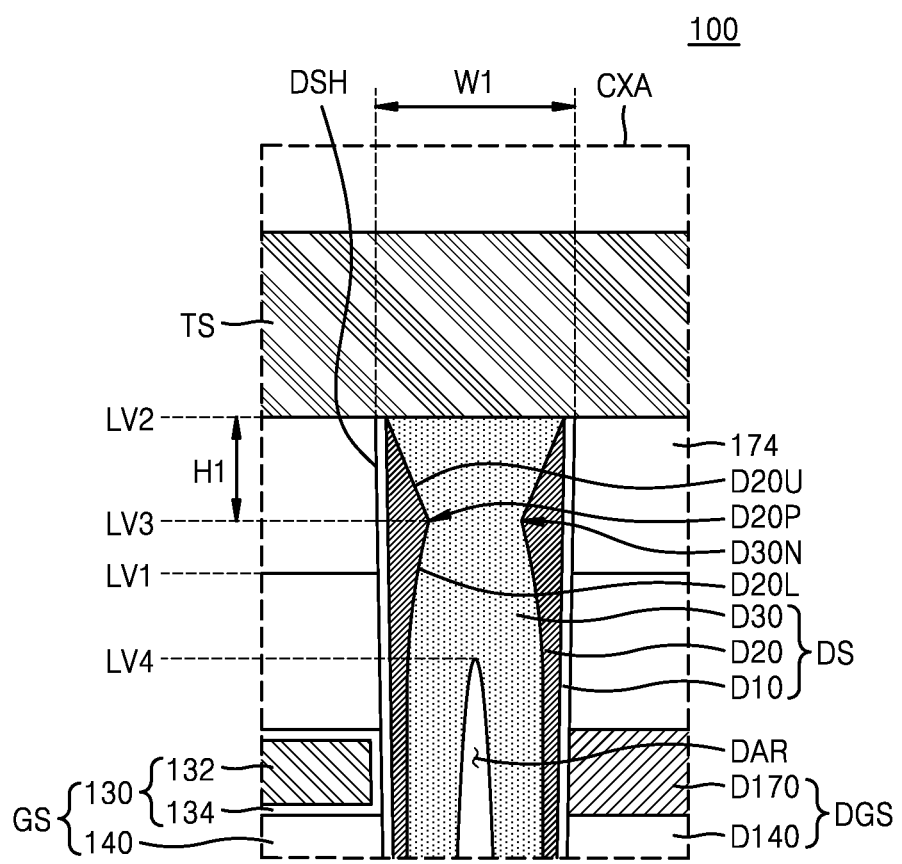
FIG. 6 is an exploded cross-sectional view of region CXA of FIG. 5.
Figure 7:
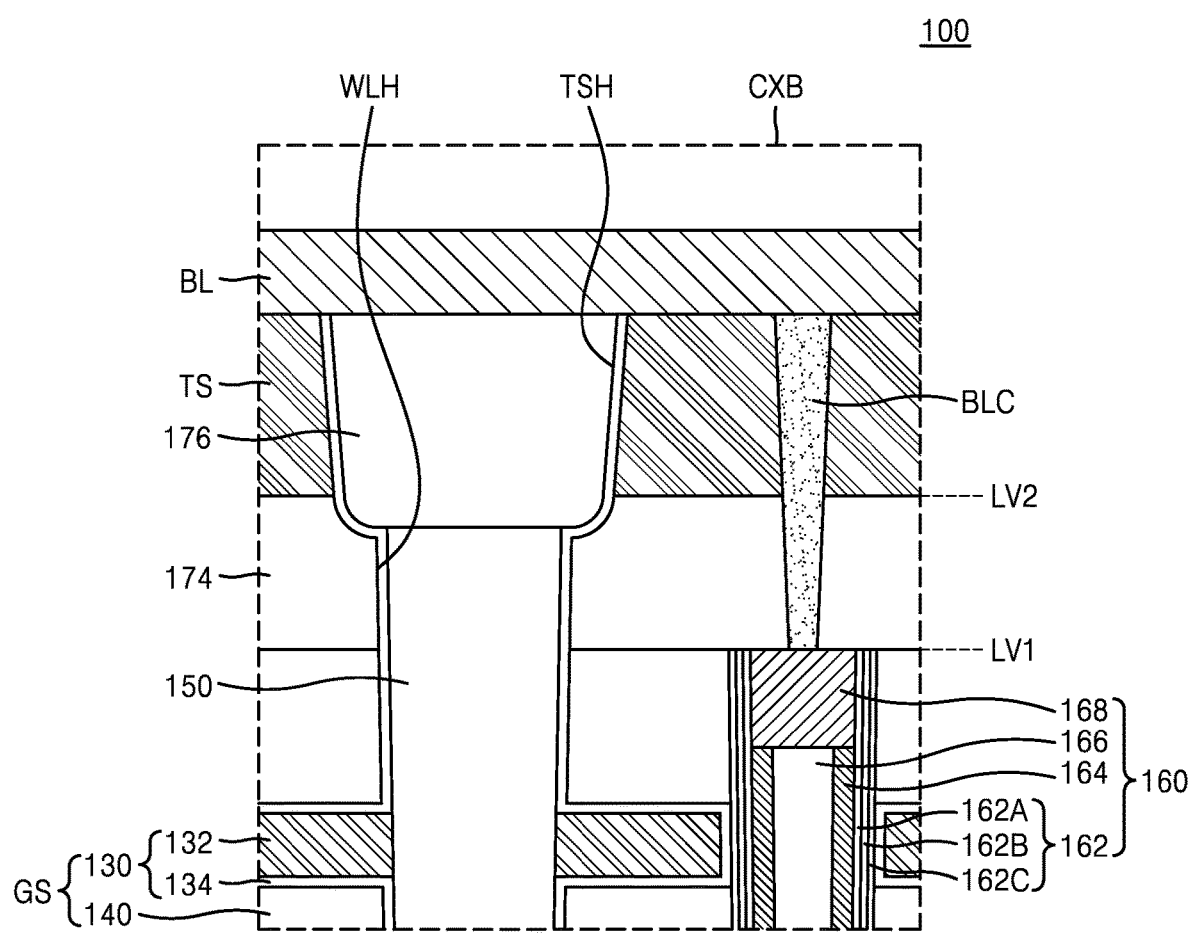
FIG. 7 is an exploded cross-sectional view of region CXB of FIG. 5.

FIGS. 4 through 7 are diagrams for describing an integrated circuit device 100 according to exemplary embodiments of the inventive concept. For example, FIG. 4 is a plan view showing a representative structure of the integrated circuit device 100 according to exemplary embodiments of the inventive concept. FIG. 5 is a cross-sectional view taken along line A1-A1' of FIG. 4. FIG. 6 is an enlarged cross-sectional view of a region CXA of FIG. 5. FIG. 7 is an enlarged cross-sectional view of region CXB of FIG. 5. In FIG. 4, for convenience of illustration and understanding, some components of the integrated circuit device 100 may be omitted.

Referring to FIGS. 4 through 7, the integrated circuit device 100 may include the peripheral circuit structure PS and the cell array structure CS arranged at a vertical level higher than the peripheral circuit structure PS. For example, the cell array structure CS may be vertically stacked on the peripheral circuit structure PS. The cell array structure CS may include a memory cell region MCR, a connection region CON, and a through electrode region TVR, and the peripheral circuit structure PS may include a peripheral circuit region PERI.

The memory cell region MCR may be a region in which a memory cell array MCA (see FIG. 3) of a vertical channel structure NAND type driven in the manner described with reference to FIG. 3 is formed. The connection region CON may be a region in which a pad portion PAD for electrical connection of the memory cell array MCA formed in the memory cell region MCR to the peripheral circuit region PERI is formed. The through electrode region TVR may be a region in which a plurality of through electrodes TVS are arranged for electrical connection of the memory cell region MCR to the peripheral circuit region PERI arranged at a lower vertical level than the memory cell region MCR.

The peripheral circuit structure PS may include a peripheral circuit transistor 60TR arranged on a substrate 50 and a peripheral circuit line structure 70. The peripheral circuit transistor 60TR may be arranged in plural on the substrate 50. On the substrate 50, an active region AC may be defined by an isolation layer 52 and the plurality of peripheral circuit transistors 60TR may be formed on the active region AC. Each of the plurality of peripheral circuit transistors 60TR may include a peripheral circuit gate 60G, and source/drain regions 62 that are arranged in a part of the substrate 50 at opposite sides of the peripheral circuit gate 60G.

In an exemplary embodiment of the inventive concept, the substrate 50 may include a semiconductor material such as, for example, an IV-group semiconductor, a III-V-group compound semiconductor, or a II-VI-group oxide semiconductor. For example, the IV-group semiconductor may include silicon (Si), germanium (Ge), or silicon-germanium. The substrate 50 may be provided as a bulk wafer or epitaxial layer. In an exemplary embodiment of the inventive concept, the substrate 50 may include a silicon-on-insulator (SOI) substrate or a germanium-on-insulator (GeOI) substrate.

The peripheral circuit line structure 70 may include a plurality of peripheral circuit contacts 72 and a plurality of peripheral circuit wiring layers 74. On the substrate 50, an interlayer insulation film 80 may cover the peripheral circuit transistor 60TR and the peripheral circuit line structure 70. The plurality of peripheral circuit wiring layers 74 may have a multi-layer structure including a plurality of metal layers arranged at different vertical levels. While the plurality of peripheral circuit wiring layers 74 is illustrated as being formed to the same height in FIG. 5, in exemplary embodiments, the peripheral circuit wiring layers 74 arranged at some levels (e.g., arranged at the top level) may be formed to a height higher than the peripheral circuit wiring layers 74 arranged at the other levels.

A base structure 110 may be arranged on the interlayer insulation film 80. In exemplary embodiments of the inventive concept, the base structure 110 may serve as a source region that supplies a current to vertical memory cells formed in the cell array structure CS. In exemplary embodiments of the inventive concept, the base structure 110 may include some regions that perform a function of the common source line CSL described with reference to FIG. 3.

The base structure 110 may include a lower base layer 110L and an upper base layer 110U sequentially arranged on the interlayer insulation film 80. An opening portion may be formed in the base structure 110 overlapping the through electrode region TVR, and a base insulation layer 120 may be arranged filling the inside of the opening portion. In exemplary embodiments of the inventive concept, the lower base layer 110L may be formed of a metal material such as tungsten (W) and the upper base layer 110U may be formed of a semiconductor material such as silicon. In exemplary embodiments of the inventive concept, both the lower base layer 110L and the upper base layer 110U may be formed of a semiconductor material such as silicon.

On the base structure 110, a first gate stack GS may extend in a first horizontal direction X and a second horizontal direction Y that are substantially parallel to a top surface of the base structure 110. The first gate stack GS may include a plurality of first gate electrodes 130 and a plurality of first insulation layers 140, which may be arranged alternately in the vertical direction Z that is substantially perpendicular to the top surface of the base structure 110.

As illustrated in FIG. 7, the first gate electrode 130 may include a buried conductive layer 132 and a dielectric liner 134 that surrounds a top surface, a bottom surface, and a side surface of the buried conductive layer 132. For example, the buried conductive layer 132 may include a metal such as tungsten, nickel, cobalt, tantalum, etc., a metal silicide such as tungsten silicide, nickel silicide, cobalt silicide, tantalum silicide, etc., doped polysilicon, or a combination thereof. In exemplary embodiments of the inventive concept, a conductive barrier layer may be further formed to surround a top surface and a sidewall of the buried conductive layer 132. The conductive barrier layer may include, for example, titanium nitride, tantalum nitride, tungsten nitride, or a combination thereof. In exemplary embodiments of the inventive concept, the dielectric liner 134 may include a high-k dielectric material such as aluminum oxide.

In exemplary embodiments of the inventive concept, the plurality of first gate electrodes 130 may correspond to the ground selection line GSL, the word line WL (WL1, WL2, . . . , WLn-1, WLn), and at least one string selection line SSL that constitute a memory cell string MS (see FIG. 3.). For example, the lowermost first gate electrode 130 may function as the ground selection line GSL, and the uppermost first gate electrode 130 may function as the string selection line SSL, and the other first gate electrode 130 may function as the word line WL. Thus, the memory cell string MS may be provided in which the ground selection transistor GST, the selection transistor SST, and the memory cell transistors MCI, MC2, . . . , MCn-1, MCn therebetween are connected in series. In exemplary embodiments of the inventive concept, at least one of the first gate electrodes 130 may function as, but is not limited to, a dummy word line.

Referring again to FIG. 4, on the base structure 110, a plurality of gate stack separation opening portions WLH may extend in the first horizontal direction X that is substantially parallel to the top surface of the base structure 110. The first gate stack GS arranged between a pair of gate stack separation opening portions WLH may constitute one block, and the pair of gate stack separation opening portions WLH may limit a width of the first gate stack GS in the second horizontal direction Y.

On the base structure 110, a gate stack separation insulation layer 150 (see FIGS. 5 and 7) may be arranged to fill the inside of the gate stack separation opening portion WLH. The gate stack separation insulation layer 150 may include, for example, silicon oxide, silicon nitride, silicon oxynitride, or a low-k dielectric material. For example, the gate stack separation insulation layer 150 may include a silicon oxide film, a silicon nitride film, SiON, SiOCN, SiCN, or a combination thereof.

In exemplary embodiments of the inventive concept, a common source line may be formed in the gate stack separation opening portion WLH. In this case, a common source region may be further formed in the base structure 110 vertically overlapping the gate stack separation opening portion WLH, and the common source line may be electrically connected to the common source region. The common source region may be an impurity region doped with n-type impurities at a high concentration, and may function as a source region that supplies electric current to memory cells.

As shown in FIGS. 5 and 7, a plurality of channel structures 160 may extend from the top surface of the base structure 110 through the first gate stack GS in the vertical direction Z in the memory cell region MCR. The plurality of channel structures 160 may be spaced apart from each other at certain intervals in the first horizontal direction X, the second horizontal direction X, and a third horizontal direction (e.g., a diagonal direction). The plurality of channel structures 160 may be arranged in a zigzag shape or a staggered shape.

Each of the plurality of channel structures 160 may be arranged in a channel hole 160H. Each of the plurality of channel structures 160 may include a gate insulation layer 162, a channel layer 164, a buried insulation layer 166, and a conductive plug 168. The gate insulation layer 162 and the channel layer 164 may be sequentially arranged on the sidewall of the channel hole 160H. For example, the gate insulation layer 162 may be conformally arranged on the sidewall of the channel hole 160H, and the channel layer 164 may be conformally arranged on the sidewall and the bottom portion of the channel hole 160H. The buried insulation layer 166 may be arranged on the channel layer 164 to fill a residual space of the channel layer 164. Above the channel hole 160H, a conductive plug 168 may be arranged to stop an inlet of the channel hole 160H (e.g., a top end of the channel hole 160H) in contact with the channel layer 164. In exemplary embodiments of the inventive concept, the buried insulation layer 166 may be omitted, and the channel layer 164 may fill a residual portion of the channel hole 160H in a pillar shape.

In exemplary embodiments of the inventive concept, the channel layer 164 may be arranged to contact the top surface of the base structure 110 in a bottom portion of the channel hole 160H. Alternatively, a contact semiconductor layer having a certain height from the bottom portion of the channel hole 160H may be further formed on the base structure 110, and the channel structure 164 may be electrically connected with the base structure 110 through the contact semiconductor layer. In exemplary embodiments of the inventive concept, unlike as shown in FIG. 5, the bottom surface of the channel layer 164 may be arranged at a vertical level that is lower than the top surface of the base structure 110.

As illustrated in FIG. 7, the gate insulation layer 162 may have a structure sequentially including a tunneling dielectric film 162A, a charge trap film 162B, and a blocking dielectric film 162C on an outer sidewall of the channel layer 164. The relative thicknesses of the tunneling dielectric film 162A, the charge trap film 162B, and the blocking dielectric film 162C that constitute the gate insulation layer 162 may be modified variously, without being limited to the illustration of FIG. 7.

The tunneling dielectric film 162A may include, for example, silicon oxide, hafnium oxide, aluminum oxide, zirconium oxide, tantalum oxide, etc. The charge trap film 162B may be a region in which electrons passing through the tunneling dielectric film 162A from the channel layer 164 are stored, and may include, for example, silicon nitride, boron nitride, silicon boron nitride, or polysilicon doped with impurities. The blocking dielectric film 162C may include, for example, silicon oxide, silicon nitride, or metal oxide having a higher dielectric constant than silicon oxide.

The metal oxide may include, for example, hafnium oxide, aluminum oxide, zirconium oxide, tantalum oxide, or a combination thereof.

In one block, the uppermost first gate electrode 130 may be horizontally divided into two parts by a string separation insulation layer. These two parts may constitute the string selection line SSL described with reference to FIG. 3.

Referring again to FIG. 5, in the connection region CON, the first gate stack GS may extend to form the pad portion PAD. In the connection region CON, the plurality of first gate electrodes 130 may extend to have a shorter length in the first horizontal direction X in a direction away from the top surface of the base structure 110. For example, in the connection region CON, the respective lengths of the first gate electrodes 130 may become shorter in the first horizontal direction X as the first gate electrodes 130 are disposed further away from the top surface of the base structure 110. The pad portion PAD may indicate parts of the first gate electrode 130 arranged in a step form. On a part of the first gate stack GS constituting the pad portion PAD, a cover insulation layer 172 may be arranged. In the connection region CON, a pad contact CNT may be connected to the first gate electrode 130 through the cover insulation layer 172.

According to exemplary embodiments, in the connection region CON, a plurality of dummy channel structures may be further formed to extend from the top surface of the base structure 110 through the first gate stack GS in the vertical direction Z. The dummy channel structure may be formed to prevent leaning, bending, etc., of the gate stack GS in a manufacturing process of the integrated circuit device 100, and to secure structural stability. Each of the plurality of dummy channel structures may have structures and shapes that are similar to those of the plurality of channel structures 160. On the first gate stack GS and the cover insulation layer 172, an upper insulation layer 174 may be arranged.

The through electrode region TVR may be arranged between the memory cell region MCR and the connection region CON, and may include a dam structure DS, a mold gate stack DGS, and a through electrode TVS.

The dam structure DS may be arranged in a dam opening portion DSH that passes through the first gate stack GS and the upper insulation layer 174 in the through electrode region TVR. The dam opening portion DSH may have a closed curve shape or a ring shape having a first width W1 in a plan view (see FIG. 4). In the plan view, the dam opening portion DSH may surround a mold gate stack DGS.

In exemplary embodiments of the inventive concept, the dam opening portion DSH may be spaced apart from a gate stack separation opening portion WLH. The dam opening portion DSH may have the first width W1 in a widthwise direction (see FIG. 4). The gate stack separation opening portion WLH may have a second width W2 in the second horizontal direction Y (see FIG. 4). In exemplary embodiments shown in FIGS. 4 through 7, the first width W1 may be substantially the same as the second width W2. However, the inventive concept is not limited thereto, and in exemplary embodiments of the inventive concept, the first width W1 may be different from the second width W2.

The mold gate stack DGS may include a plurality of mold layers D170 and a plurality of insulation layers D140, which may be arranged alternately in the vertical direction Z that is substantially perpendicular to the top surface of the base structure 110. Insulation layers D140 of the plurality of insulation layers D140 may be substantially coplanar with corresponding insulation layers 140 of the plurality of insulation layers 140 of the first gate stack GS, and mold layers D170 of the plurality of mold layers D170 may be substantially coplanar with corresponding first gate electrodes 130 of the plurality of first gate electrodes 130 of the first gate stack GS. For example, top surfaces of insulation layers D140 and insulation layers 140 disposed at the same vertical level may be substantially aligned with each other, and top surfaces of mold layers D170 and first gate electrodes 130 disposed at the same vertical level may be substantially aligned with each other. The dam opening portion DSH in the closed curve shape may pass through a sacrificial gate stack SGS (see FIG. 17B) in a process of manufacturing the integrated circuit device 100, such that a part of the sacrificial gate stack SGS surrounded by the dam opening portion DSH remains without being removed in replacement of the first gate electrode 130, thus forming the mold gate stack DGS. Thus, each of the plurality of insulation layers D140 may include the same material as the plurality of insulation layers 140, and each of the plurality of mold layers D170 may include a material having an etching selectivity with respect to the plurality of insulation layers 140.

The dam structure DS may include an insulation liner D10, an insulation spacer D20, and a buried layer D30 that are arranged on the inner wall of the dam opening portion DSH.

The insulation liner D10 may be conformally formed on the inner wall of the dam opening portion DSH and may include, for example, silicon oxide. As shown in FIG. 6, the insulation liner D10 arranged on one of both sidewalls of the dam opening portion DSH may contact the first gate stack GS, and the insulation liner D10 arranged on the other one of the sidewalls of the dam opening portion DSH may contact the mold gate stack DGS. Thus, the dam structure DS may include a first sidewall (e.g., corresponding to the insulation liner D10) that contacts at least one of the plurality of first gate electrodes 130, and a second sidewall (e.g., corresponding to the insulation liner D10) that is opposite to the first sidewall and that contacts at least one of the plurality of mold layers D170.

The insulation spacer D20 may be arranged on the inner wall of the dam opening portion DSH. In exemplary embodiments of the inventive concept, the insulation spacer D20 may include a material having an etching selectivity with respect to the insulation liner D10, e.g., silicon nitride or silicon oxynitride.

The insulation spacer D20 may include a protrusion portion D20P having a largest horizontal width at an upper side of the insulation spacer D20, a pair of main sidewalls D20L arranged at a lower vertical level than the protrusion portion D20P, and a pair of sloped sidewalls D20U arranged at a higher vertical level than the protrusion portion D20P at an upper side of the dam opening portion DSH. Herein, the terms "level" and "vertical level" may refer to a distance from the top surface of the substrate 50 in the vertical direction Z. For example, the pair of sloped sidewalls D20U may refer to a first sidewall D20U that is arranged on one of the sidewalls of the dam opening portion DSH, is arranged at a higher vertical level than the protrusion portion D20P, and contacts the buried layer D30, and a second sidewall D20U that is arranged on the other one of the sidewalls of the dam opening portion DSH, is arranged at a higher vertical level than the protrusion portion D20P, and contacts the buried layer D30.

The sidewalls D20U belonging to the pair of sloped sidewalls D20U may be inclined away from each other in a direction toward the upper side of the dam opening portion DSH. For example, a distance between the pair of sloped sidewalls D20U may decrease in a direction toward the upper side of the dam opening portion DSH. Herein, a case in which the distance of the pair of sloped sidewalls D20U from the base structure 110 increases in a direction away from the base structure 110 may be referred to as a case in which the pair of sloped sidewalls D20U have a positive slope. As illustrated in FIG. 6, when a top surface of the first gate stack GS is arranged at a first vertical level LV1 and a top surface of the dam structure DS is arranged at a second vertical level LV2 that is higher than the first vertical level L1, the protrusion portion D20P of the insulation spacer D20 may be arranged at a third vertical level LV3 that is lower than the second vertical level LV2 and higher than the first vertical level LV1. That is, the pair of sloped sidewalls D20U may have a positive slope at a vertical level between the second vertical level LV2 and the third vertical level LV3.

The buried layer D30 may fill the remaining space of the dam opening portion DSH, that is, a space defined by the pair of sloped sidewalls D20U and the pair of main sidewalls D20L of the insulation spacer D20. The buried layer D30 may include an air space DAR therein. The buried layer D30 may include a neck portion D30N at the upper side of the dam opening portion DSH. The neck portion D30N may be arranged at the same vertical level (e.g., the third vertical level LV3) as the protrusion portion D20P of the insulation spacer D20, and the buried layer D30 may have the smallest horizontal width in the neck portion D30N. For example, a distance between the pair of sloped sidewalls D20U may be shortest at a vertical level that is substantially the same as (e.g., substantially aligned with) the level of the neck portion D30N. In exemplary embodiments of the inventive concept, the neck portion D30N may have a first height H1 from a top surface of the buried layer D30 in a vertical direction. The first height H1 may be, for example, about 30 nm to about 200 nm. However, the first height H1 is not limited thereto.

In exemplary embodiments of the inventive concept, the buried layer D30 may include polysilicon. The buried layer D30 may include the air space DAR therein. The air space DAR may be arranged at a vertical level that is lower than the pair of sloped sidewalls D20U of the insulation spacer D20 (e.g., lower than the protrusion portion D20P or the neck portion D30N of the buried layer D30). For example, the uppermost portion of the air space DAR may be arranged at a fourth vertical level LV4, which may be lower than the third vertical level LV3. In addition, in exemplary embodiments, the air space DAR is not arranged in a part of the buried layer D30 arranged at a level higher than the level of the neck portion D30N. For example, in exemplary embodiments, the air space DAR is not arranged in a part of the buried layer D30 arranged at a level higher than the third vertical level LV3.

Figure 18A:
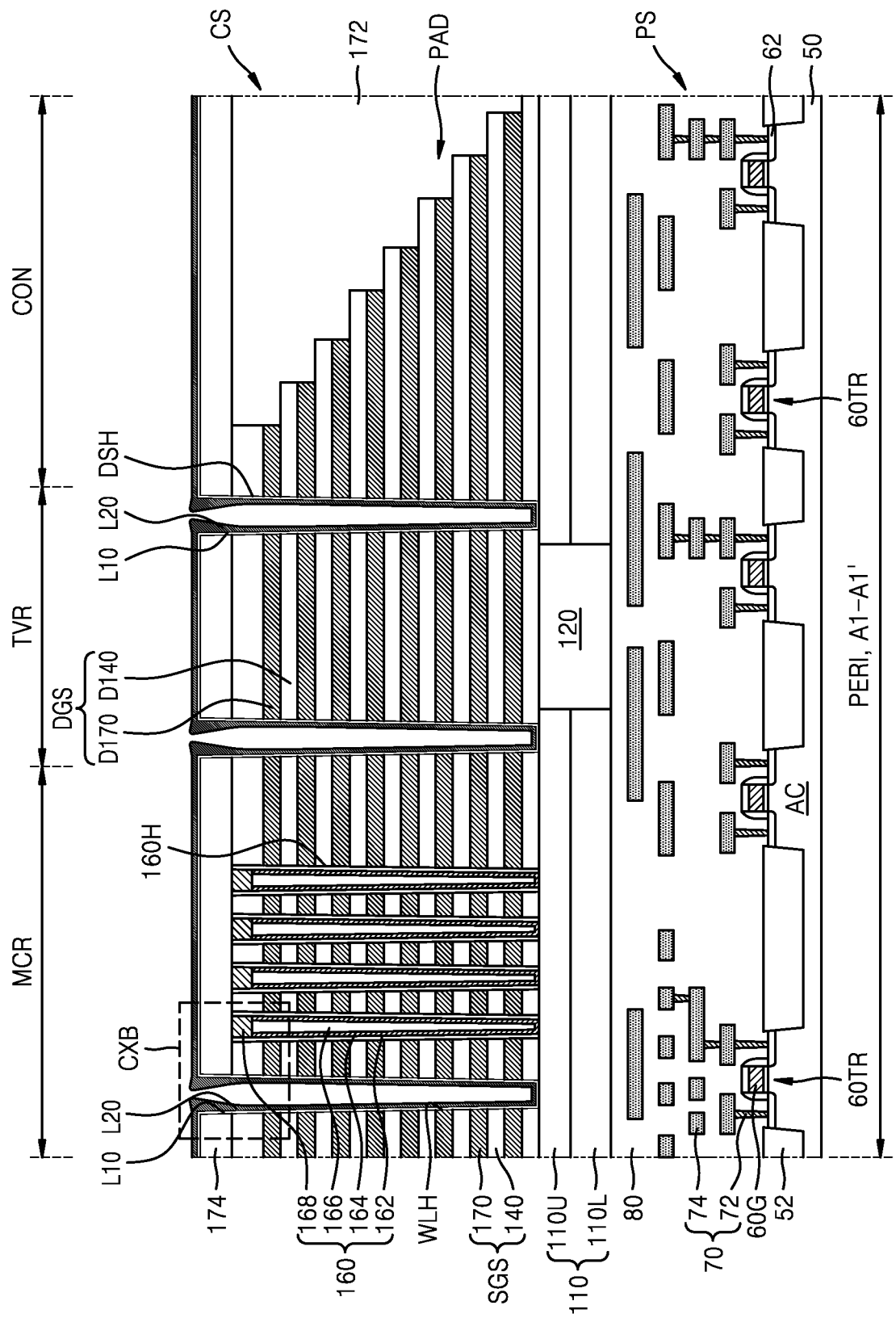
Figure 18B:
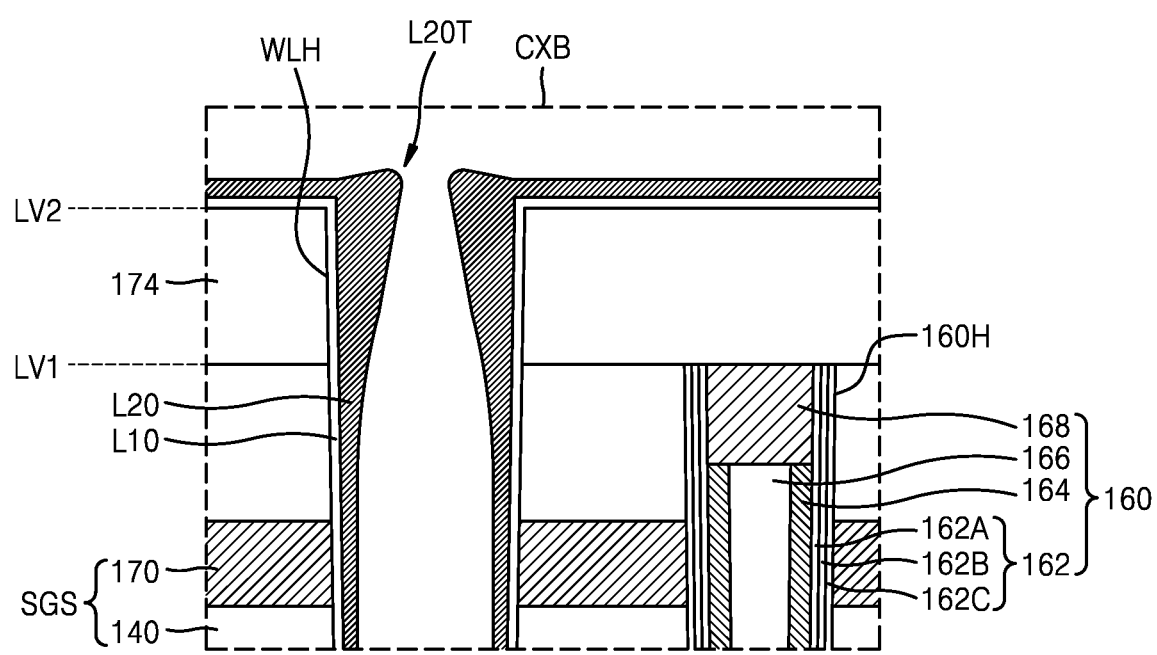

In an exemplary manufacturing process, an insulation spacer layer L20 (see FIG. 18B) may be formed using a material having poor step coverage on the inner wall of the dam opening portion DSH, and the pair of sloped sidewalls D20U having a positive slope may be formed by chamfering an overhang portion L20T of the insulation spacer layer L20 (see FIG. 18B). Thus, in a subsequent process, in a process of filling the buried layer D30 in the dam opening portion DSH, the air space DAR may be confined to a lower vertical level (e.g., a fourth vertical level LV4) than the pair of sloped sidewalls D20U, and the buried layer D30 between the pair of sloped sidewalls D20U may be filled with, for example, a polysilicon material layer without having the air space DAR formed.

An upper support layer TS may be arranged on the first gate stack GS, the mold gate stack DGS, and the dam structure DS. The upper support layer TS may include a plurality of opening portions TSH, which may vertically overlap the gate stack separation opening portion WLH. The upper support layer TS may prevent a process defect caused by bending or leaning of the first gate stack GS by giving structural stability to the first gate stack GS in a process of manufacturing the integrated circuit device 100.

An upper buried layer 176 may fill the inside of the plurality of opening portions TSH. In exemplary embodiments of the inventive concept, the upper buried layer 176 may be formed of the same material as the gate stack separation insulation layer 150. The upper support layer TS and the upper buried layer 176 may include, for example, silicon oxide or silicon oxynitride.

As illustrated in FIGS. 4 and 5, in exemplary embodiments, the plurality of opening portions TSH does not vertically overlap the mold gate stack DGS and the dam structure DS, such that the entire top surface of the dam structure DS may be covered with the upper support layer TS. As illustrated in FIG. 7, the dielectric liner 134 covering a top surface and a sidewall of the buried conductive layer 132 may be conformally arranged by extending on the inner wall of the gate stack separation opening portion WLH.

A bit line contact BLC may contact the conductive plug 168 of the channel structure 160 through the upper support layer TS and the upper insulation layer 174, and the bit line BL contacting the bit line contact BLC may extend on the upper support layer TS in the second horizontal direction Y. In the through electrode region TVR and the connection region CON, a conductive line ML may be formed on the upper support layer TS. An additional insulation layer may be further formed between the upper support layer TS and the bit line BL and between the upper support layer TS and the conductive line ML.

In the through electrode region TVR, the plurality of through electrodes TVS may extend to the peripheral circuit structure PS through the upper support layer TS, the upper insulation layer 174, the mold gate stack DGS, and the base insulation layer 120. A plurality of through holes TVH may expose a top surface of the peripheral circuit wiring layer 74 through the upper support layer TS, the upper insulation layer 174, the mold gate stack DGS, and the base insulation layer 120, and the plurality of through electrodes TVS may fill the inside of the plurality of through holes TVH. In a plan view, the plurality of through electrodes TVS may be surrounded by the dam structure TS.

As the height of the first gate stack GS increases, an aspect ratio of the gate stack separation opening portion WLH (e.g., a ratio of the height of the first gate stack GS to the second width W2 of the gate stack separation opening portion WLH) may increase, and in a process of forming the first gate stack GS or a process of forming the bit line contact BLC and the pad contact CNT, a defect may occur due to, for example, bending or leaning of the first gate stack GS.

According to an exemplary embodiment of the inventive concept, the gate stack separation opening portion WLH and the dam opening portion DSH that pass through a mold stack SGS (see FIG. 16B), and a sacrificial buried structure WSG (see FIG. 20B) may be formed inside the gate stack separation opening portion WLH, the dam structure DS may be formed inside the dam opening portion DSH, and then the upper support layer TS may be formed on the mold stack SGS. The upper support layer TS may prevent bending or leaning of the mold stack SGS and remove the sacrificial buried structure WSG arranged in the gate separation opening portion WLH through the opening portion TSH of the upper support layer TS, and a process of replacing the first gate electrode 130 may be performed through the gate stack separation opening portion WLH. For example, to prevent bending or leaning of the mold stack SGS in a process of forming the sacrificial buried structure WSG, buried layers W30 and D30 including air spaces WAR and DAR may be formed. However, when the width of an inlet of the gate stack separation opening portion WLH is relatively small, and thus, the air space WAR (see FIG. 21C) is arranged to extend to a higher level inside the sacrificial buried structure WSG and the dam structure DS, the buried layers W30 and D30 that stop the air spaces WAR and DAR in planarization of the buried layers W30 and D30 may be removed and the air spaces WAR and DAR may be exposed to the atmosphere outside the buried layers W30 and D30. Since an insulation material may permeate inside the air spaces WAR and DAR exposed to the outside, an oxide residue may remain.

However, according to the above-described exemplary embodiment of the inventive concept, by chamfering the overhang portion L20T at the upper side of the insulation spacer layer L20 (see FIG. 21C), the pair of sloped sidewalls W20U and D20U having a positive slope may be formed. Thus, in a process of filling the buried layers W30 and D30, the air spaces WAR and DAR may be formed at the lower vertical level (e.g., the fourth vertical level LV4) than the pair of sloped sidewalls W20U and D20U. Thus, in exemplary embodiments, in planarization of the buried layers W30 and D30, the air spaces WAR and DAR are not exposed to the atmosphere outside the buried layers W30 and D30, and thus, an insulation material does not permeate the inside of the air spaces WAR and DAR.

Figure 8:
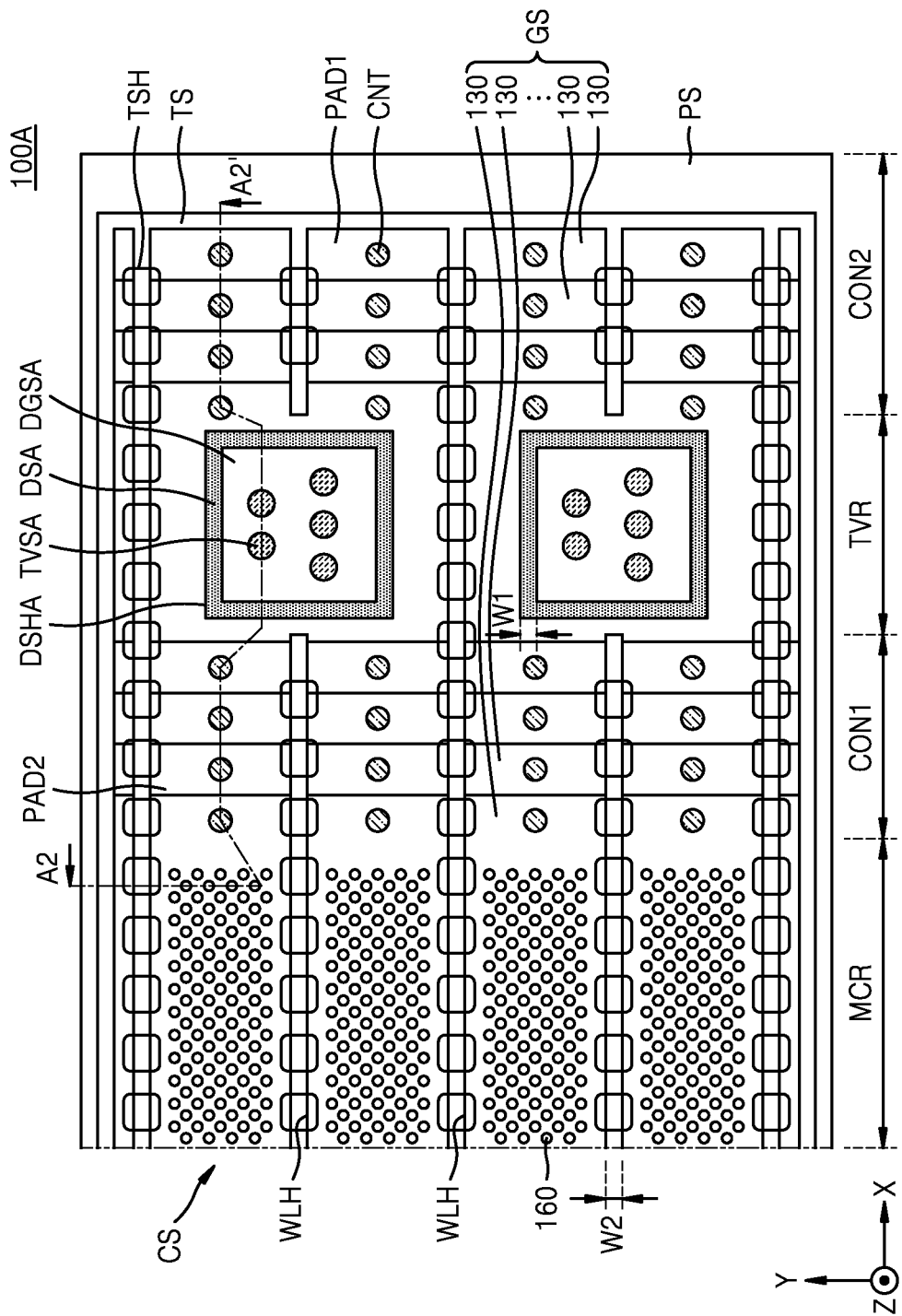
FIG. 8 is a plan view of an integrated circuit device according to exemplary embodiments of the inventive concept.
Figure 9:
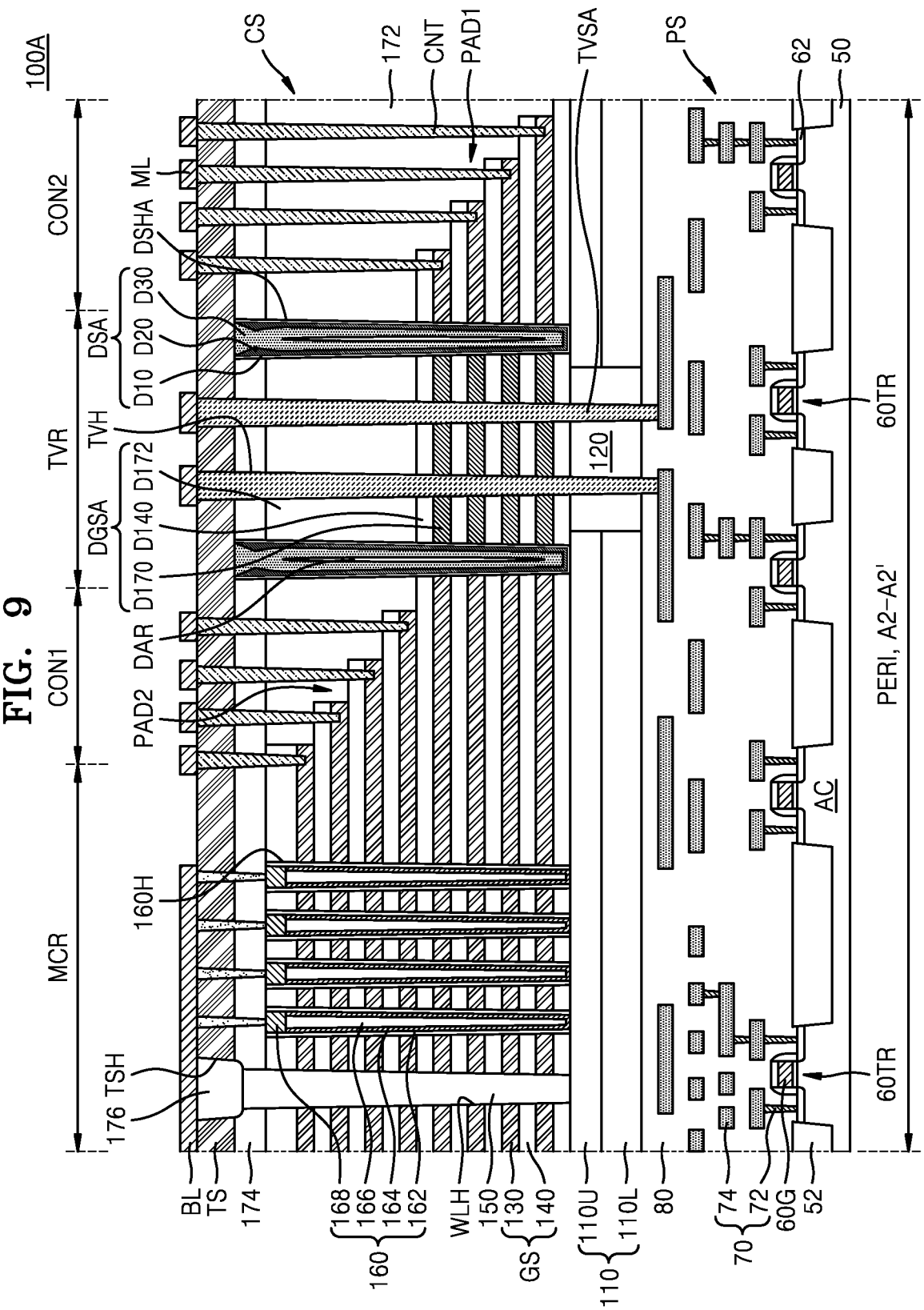
FIG. 9 is a cross-sectional view of taken along line A2-A2' of FIG. 8.

FIG. 8 is a plan view of an integrated circuit device 100A according to exemplary embodiments of the inventive concept. FIG. 9 is a cross-sectional view taken along line A2-A2' of FIG. 8.

Referring to FIGS. 8 and 9, the through electrode region TVR may be arranged between a first connection region CON1 and a second connection region CON2. The through electrode region TVR may be formed in a flat pad region arranged between a first pad portion PAD1 and a second pad portion PAD2.

A dam structure DSA may be arranged in a dam opening portion DSHA that passes through a gate stack GS and the cover insulation layer 172. The upper side of the dam structure DSA may be surrounded by the cover insulation layer 172 and the lower side of the dam structure DSA may be surrounded by the gate stack GS.

The mold gate stack DGSA may include the plurality of mold layers D170 and the plurality of insulation layers D140, which may be arranged alternately, and the cover insulation layer D172 arranged on the top insulation layer D140. The uppermost mold layer 170 may be arranged at a lower level than the uppermost first gate electrode 130 of the gate stack GS. A plurality of through electrodes TVSA may pass through the plurality of mold layers D170, the plurality of insulation layers D140, and the cover insulation layer D172.

Figure 10:
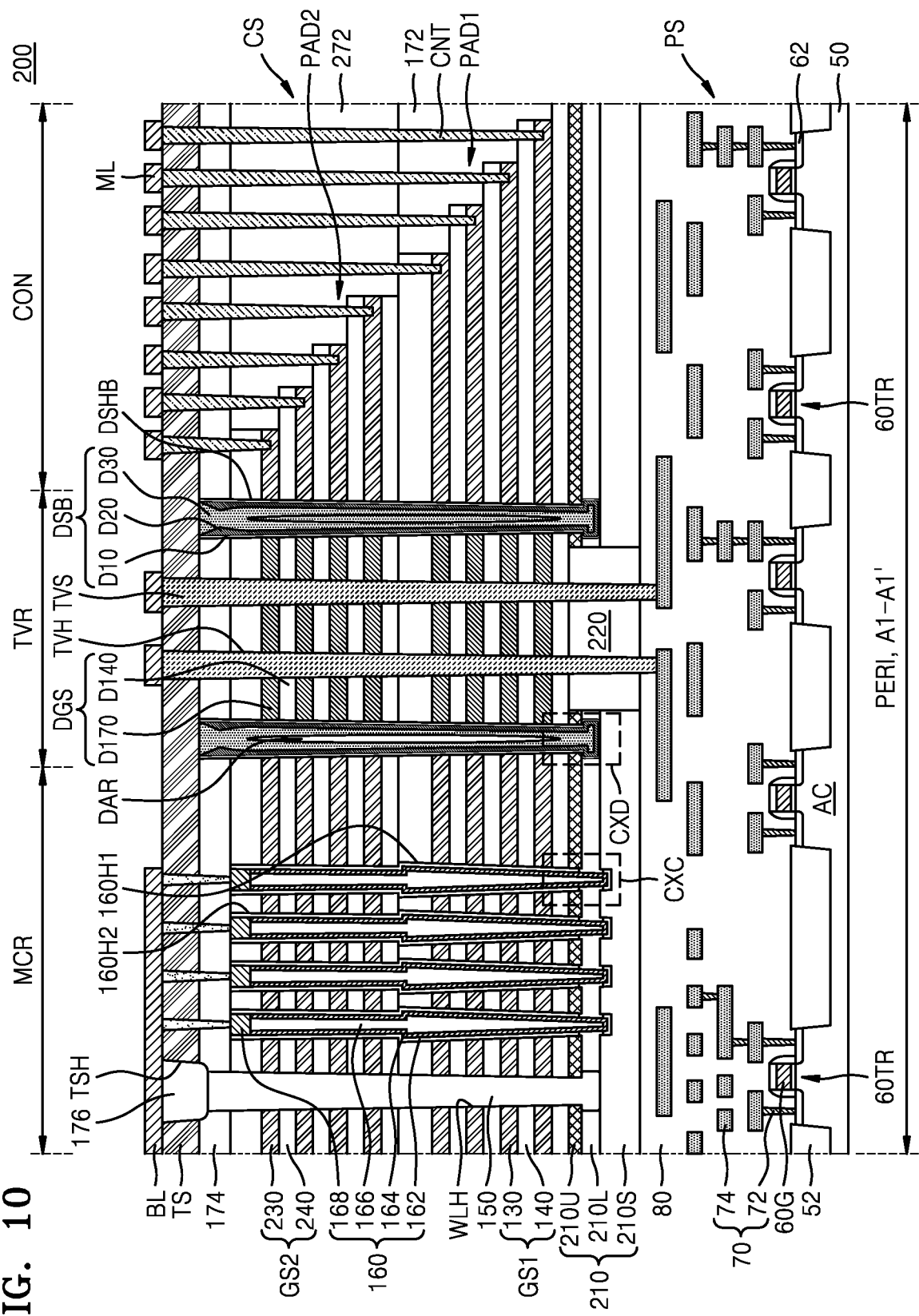
FIG. 10 is a plan view of an integrated circuit device according to exemplary embodiments of the inventive concept.
Figure 11:
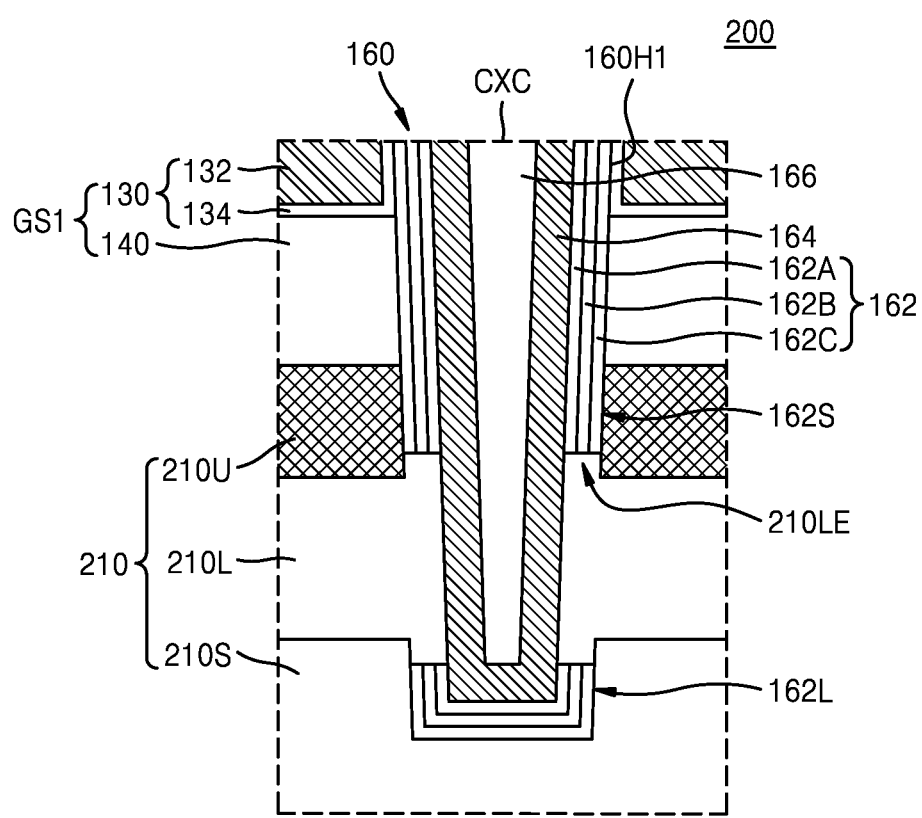
FIG. 11 is an exploded cross-sectional view of portion CXC of FIG. 10.
Figure 12:
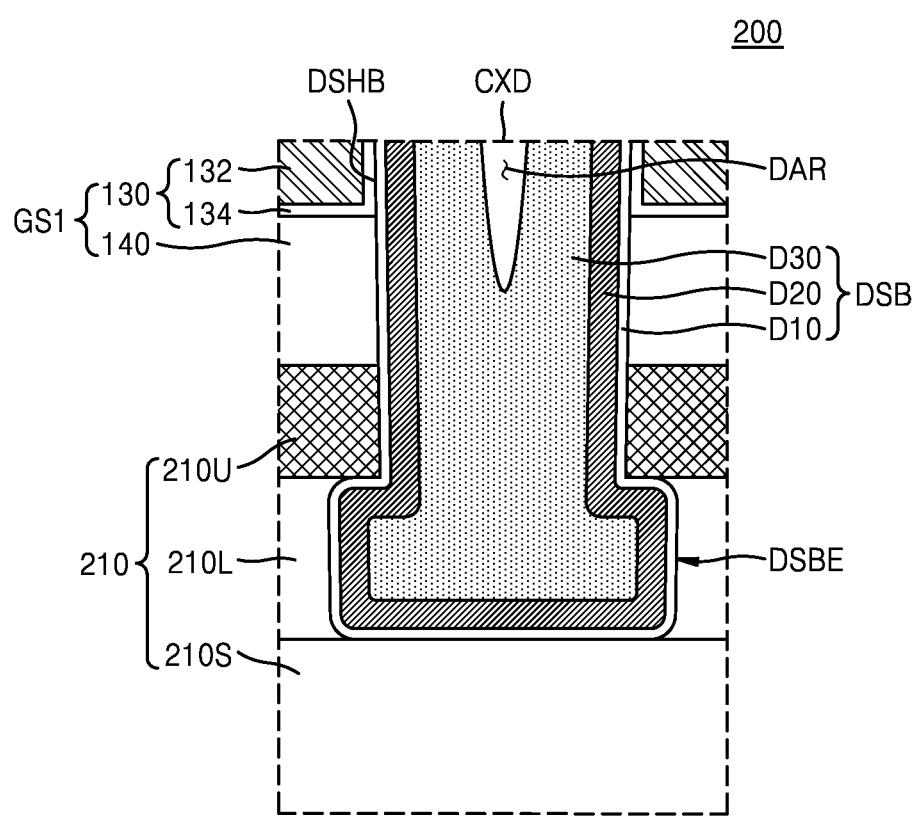
FIG. 12 is an exploded cross-sectional view of portion CXD of FIG. 10.

FIG. 10 is a plan view of an integrated circuit device 200 according to exemplary embodiments of the inventive concept. FIG. 11 is an exploded cross-sectional view of portion CXC of FIG. 10. FIG. 12 is an exploded cross-sectional view of portion CXD of FIG. 10.

Referring to FIGS. 10 through 12, a base structure 210 may be arranged on the peripheral circuit structure PS. The base structure 210 may include a base substrate 210S, a lower base layer 210L, and an upper base layer 210U that are sequentially arranged on an interlayer insulation film 80. The base substrate 210S may include a semiconductor material such as, for example, silicon. The lower base layer 210L may include polysilicon doped with impurities or polysilicon that is not doped with impurities, and the upper base layer 210U may include polysilicon doped with impurities or polysilicon that is not doped with impurities. The lower base layer 210L may correspond to the common source line CSL described with reference to FIG. 3. The upper base layer 210U may act as a support layer for preventing collapse or fall of the mold stack in a process of removing a sacrificial material layer for forming the lower base layer 210L. An opening portion may be formed in the base structure 210 overlapping the through electrode region TVR, and a base insulation layer 220 filling the inside of the opening portion may be arranged.

A first gate stack GS1 may be arranged on the base structure 210, and a second gate stack GS2 may be arranged on the first gate stack GS1. The first gate stack GS1 may include the plurality of first gate electrodes 130 and the plurality of first insulation layers 140 that are arranged alternately, and the second gate stack GS2 may include a plurality of second gate electrodes 230 and a plurality of second insulation layers 240 that are arranged alternately.

The plurality of channel structures 160 may include a first channel hole 160H1 passing through the first gate stack GS1 and a second channel hole 160H2 passing through the second gate stack GS2. The plurality of channel structures 160 may have a shape protruding outwardly from boundaries of the first channel hole 160H1 and the second channel hole 160H2.

The plurality of channel structures 160 may contact the base substrate 210S through the upper base layer 210U and the lower base layer 210L. As shown in FIG. 11, a part of the gate insulation layer 162 may be removed at the same level as the lower base layer 210L, and the channel layer 164 may contact an extension portion 210LE of the lower base layer 210L. A sidewall portion 162S and a bottom portion 162L of the gate insulation layer 162 are spaced apart from each other with the extension portion 210LE of the lower base layer 210L therebetween. The bottom portion 162L of the gate insulation layer 162 may surround a bottom surface of the channel layer 164, such that the channel layer 164 may be electrically connected to the lower base layer 210L instead of directly contacting the base substrate 210S.

In the connection region CON, the first gate stack GS1 may extend to constitute the first pad portion PAD1, and a first cover insulation layer 172 that covers the first pad portion PAD1 may be arranged. In addition, the second gate stack GS2 may extend to constitute the second pad portion PAD2, and a second cover insulation layer 272 that covers the second pad portion PAD2 may be arranged.

A bottom portion of a dam opening portion DSHB may be arranged at a lower level (e.g., the same level as a bottom surface of the lower base layer 210L) than a top surface of the lower base layer 210L. For example, an extension portion DSBE protruding in a lateral direction at the same level as the lower base layer 210L may be formed in the bottom portion of the dam opening portion DSHB.

The plurality of through electrodes TVS may connect the conductive line ML with the peripheral circuit structure PS by passing through the upper support layer TS, the upper insulation layer 174, the mold gate stack DGS, and the base insulation layer 220. The mold gate stack DGS may include the plurality of mold layers D170 and the plurality of insulation layers D140. Each of the plurality of insulation layers D140 may be substantially coplanar with a corresponding one of the plurality of first insulation layers 140 of the first gate stack GS1 and a corresponding one of the plurality of second insulation layers 240 of the second gate stack GS2, and each of the plurality of mold layers D170 may be substantially coplanar with a corresponding one of the plurality of first gate electrodes 130 of the first gate stack GS1 and a corresponding one of the plurality of second gate electrodes 230 of the second gate stack GS2. For example, top surfaces of insulation layers D140, first insulation layers 140 of the first gate stack GS1, and second insulation layers 240 of the second gate stack GS2 disposed at the same vertical level may be substantially aligned with each other, and top surfaces of mold layers D170, first gate electrodes 130 of the first gate stack GS1, and second gate electrodes 230 of the second gate stack GS2 disposed at the same vertical level may be substantially aligned with each other.

Figure 13:
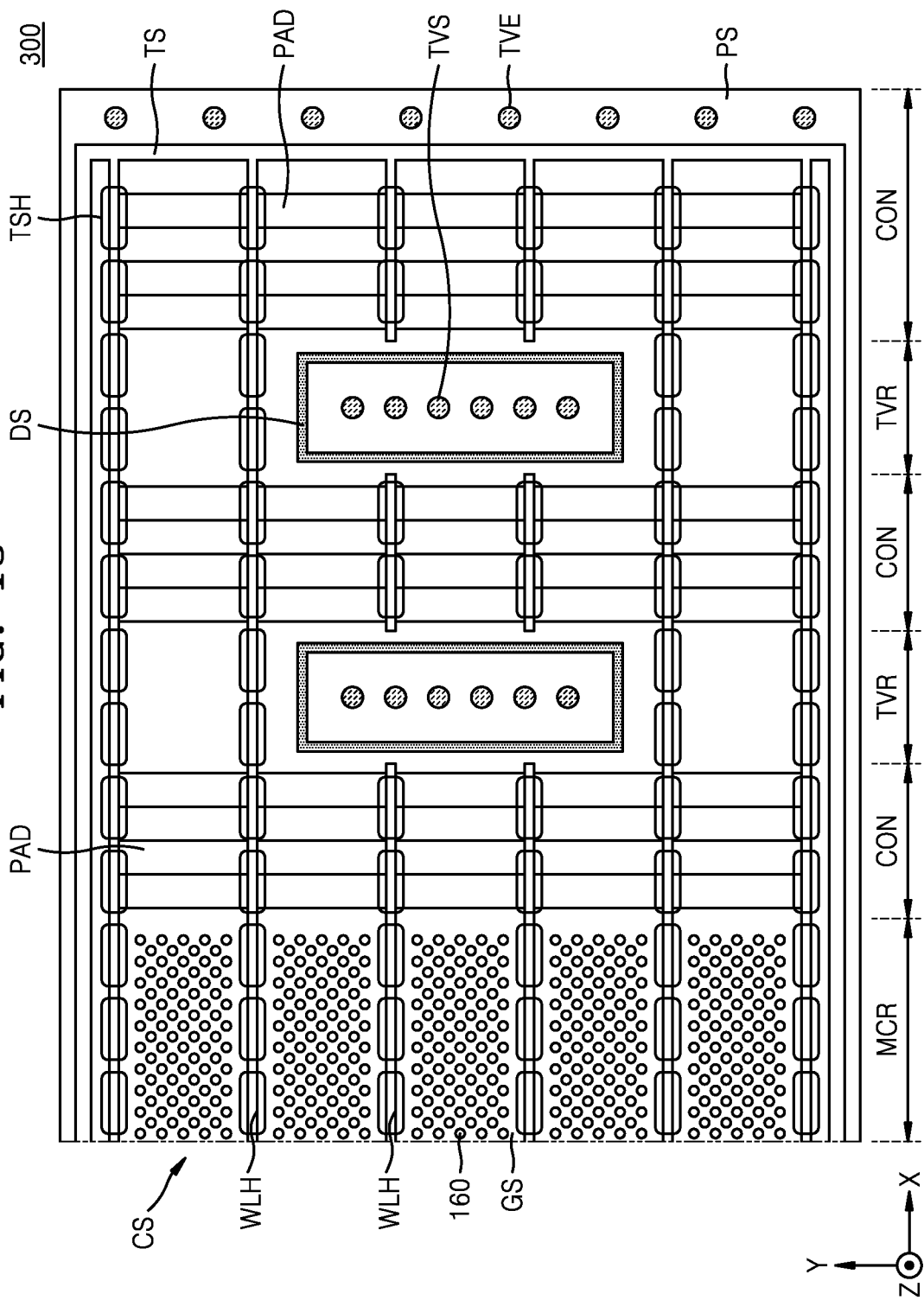
FIG. 13 is a plan view of an integrated circuit device according to exemplary embodiments of the inventive concept.

FIG. 13 is a plan view of an integrated circuit device 300 according to exemplary embodiments of the inventive concept.

Referring to FIG. 13, the integrated circuit device 300 may include the plurality of through electrode regions TVR, each of which may be arranged between two connection regions CON. In each of the plurality of through electrode regions TVR, a width in the second horizontal direction Y may be greater than a width in the first horizontal direction X, and each through electrode region TVR may overlap two adjacent substantially parallel gate stack separation opening portions WLH in the second horizontal direction Y.

An edge through electrode TVE may be further formed in an edge portion of the outermost connection region CON. In exemplary embodiments, the edge through electrode TVE does not pass through the base structure 110 (see FIG. 5).

FIGS. 14A through 24B are schematic views showing a method of manufacturing the integrated circuit device 100 according to exemplary embodiments of the inventive concept in a processing order. For example, FIGS. 14A, 15A, 16A, 17A, 20A, 21A, 22A, 23A, and 24A are plan views of the integrated circuit device 100 in a processing order, FIGS. 14B, 15B, 16B, 17B, 18A, 19A, 20B, 21B, 22B, 23B, and 24B are cross-sectional views taken along line A1-A1' of FIGS. 14A, 15A, 16A, 17A, 20A, 21A, 22A, 23A, and 24A, and FIGS. 18B, 19B, 20C, and 21C are exploded cross-sectional views of region CXB of FIGS. 18A, 19A, 20B, and 21B.

Figure 14A:
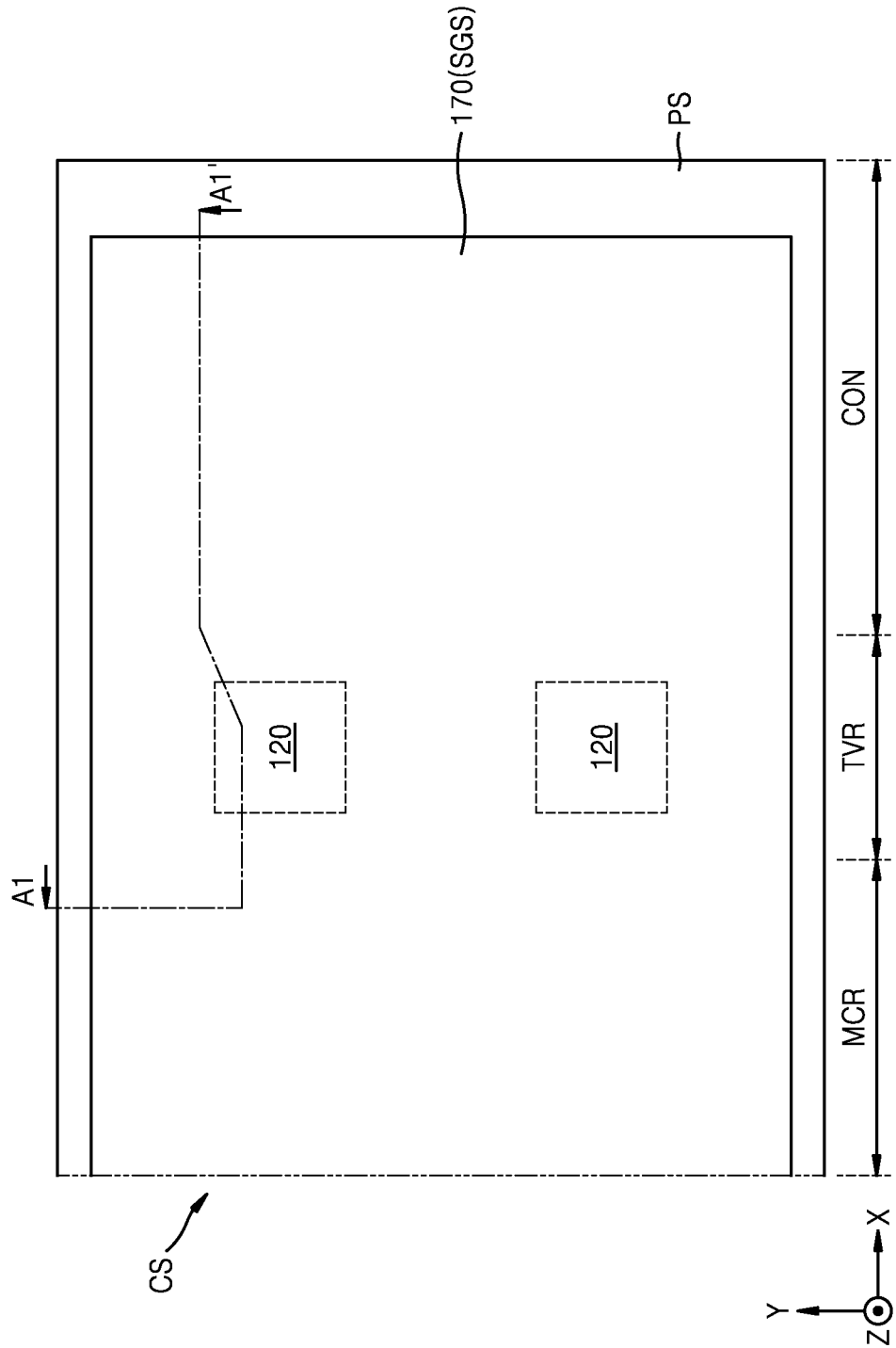
Figure 14B:
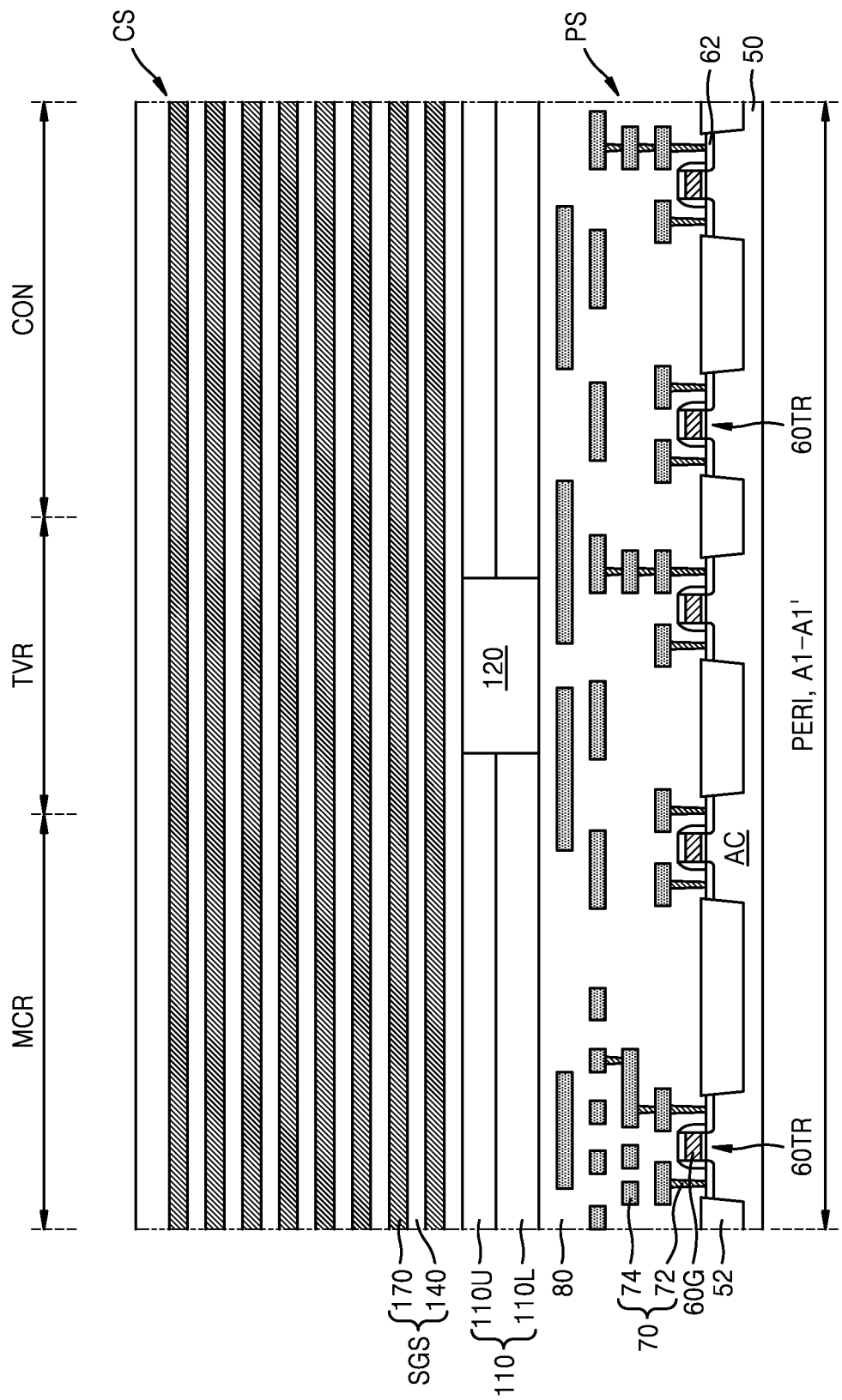

Referring to FIGS. 14A and 14B, the peripheral circuit structure PS may be formed on the substrate 50. In exemplary embodiments of the inventive concept, the substrate 50 may be a single crystalline silicon substrate. A plurality of peripheral circuit transistors 60TR may be formed on the substrate 50, and the sacrificial peripheral circuit line structure 70 and the interlayer insulation film 80 electrically connected to the peripheral circuit transistors 60TR may be formed.

Thereafter, the base structure 110 may be formed on the interlayer insulation film 80.

In exemplary embodiments of the inventive concept, the lower base layer 110L and the upper base layer 110U may be sequentially formed and an opening portion passing through the base structure 110 may be formed, after which the base insulation layer 120 filling the inside of the opening portion may be formed.

By alternately forming the plurality of first insulation layers 140 and the plurality of first mold layers 170 on the top surface of the base structure 110, the sacrificial gate stack SGS may be formed. In exemplary embodiments of the inventive concept, the plurality of first insulation layers 140 may include an insulation material such as, for example, silicon oxide, silicon oxynitride, etc., and the plurality of first mold layers 170 may include, for example, silicon oxide, silicon oxynitride, polysilicon doped with impurities, etc.

Figure 15A:
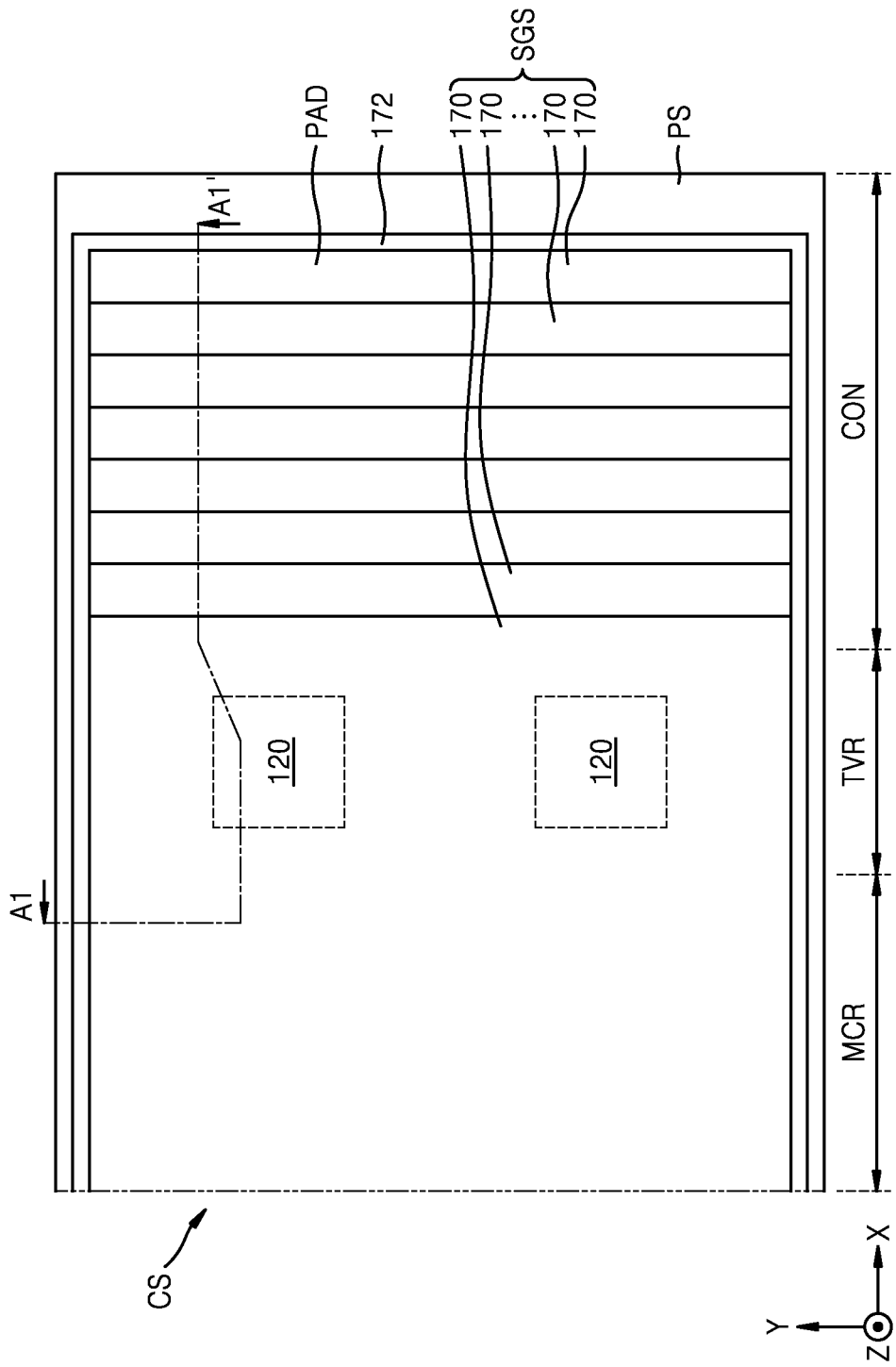
Figure 15B:
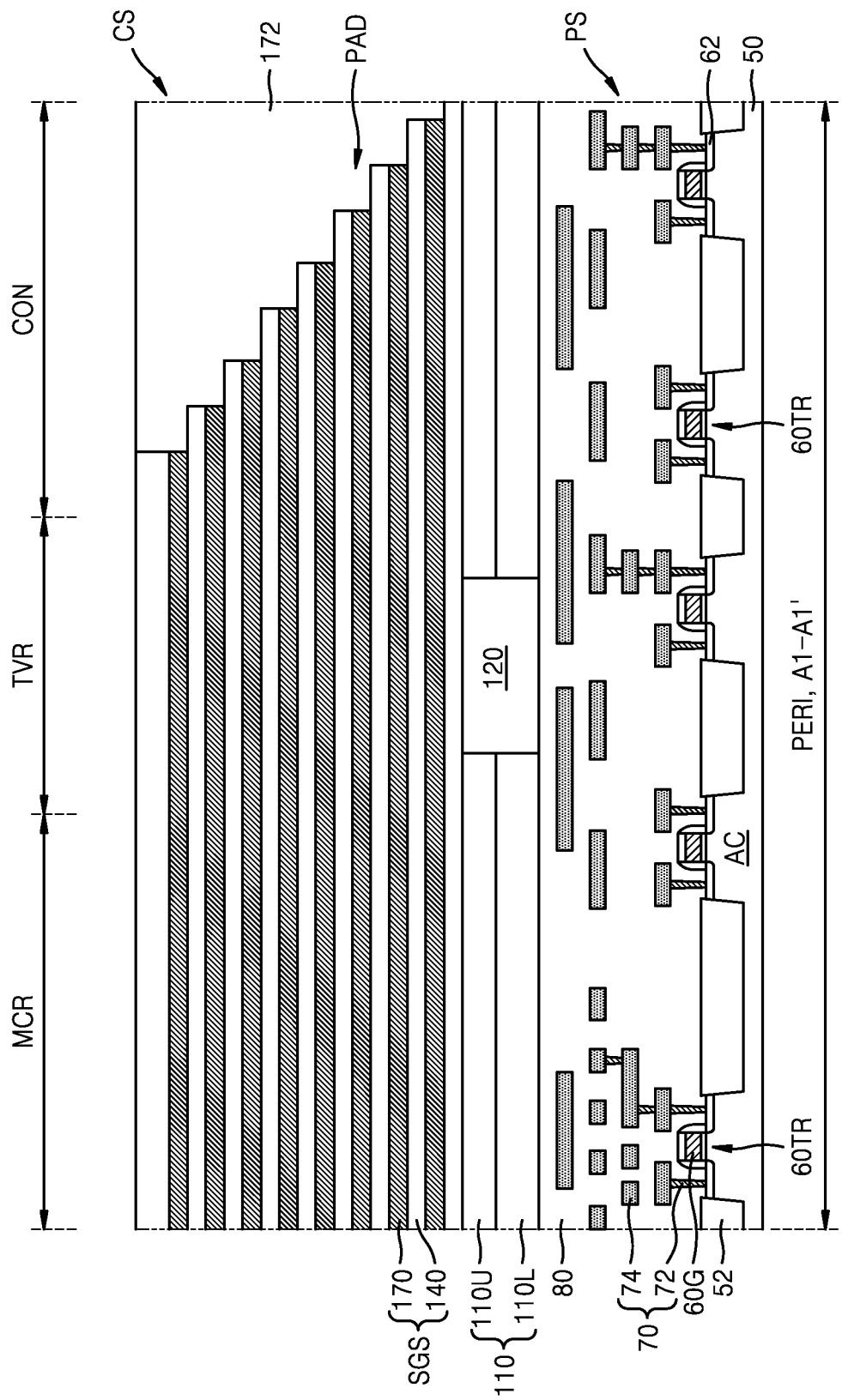

Referring to FIGS. 15A and 15B, by sequentially patterning the sacrificial gate stack SGS in the connection region CON, the pad portion PAD may be formed. In exemplary embodiments of the inventive concept, the pad portion PAD may be formed in the form of a step having a difference in top surface level in the first horizontal direction X.

Thereafter, the cover insulation layer 172 covering the pad portion PAD may be formed. The cover insulation layer 172 may include an insulation material such as, for example, silicon oxide, silicon oxynitride, etc.

Figure 16A:
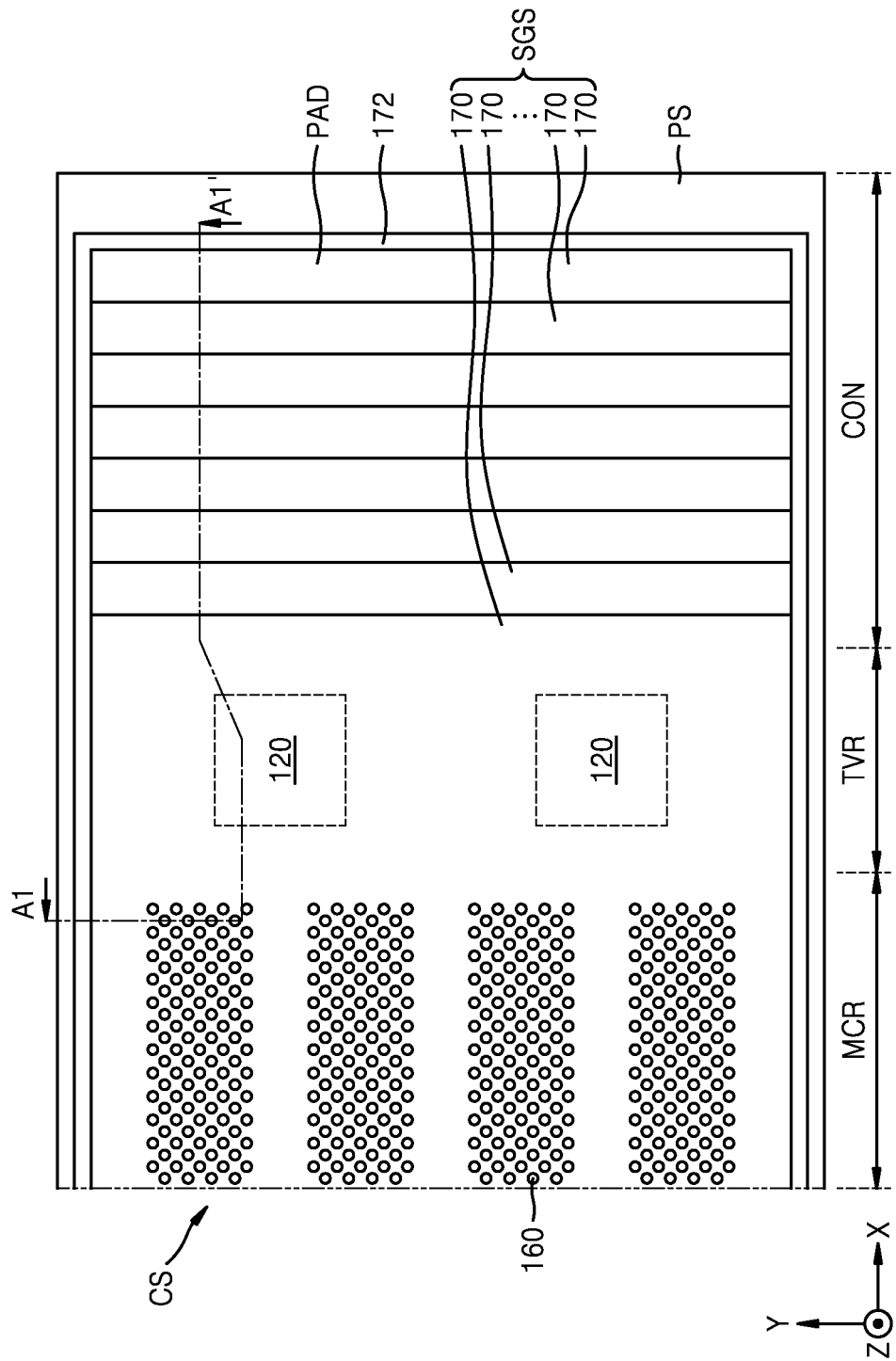
Figure 16B:
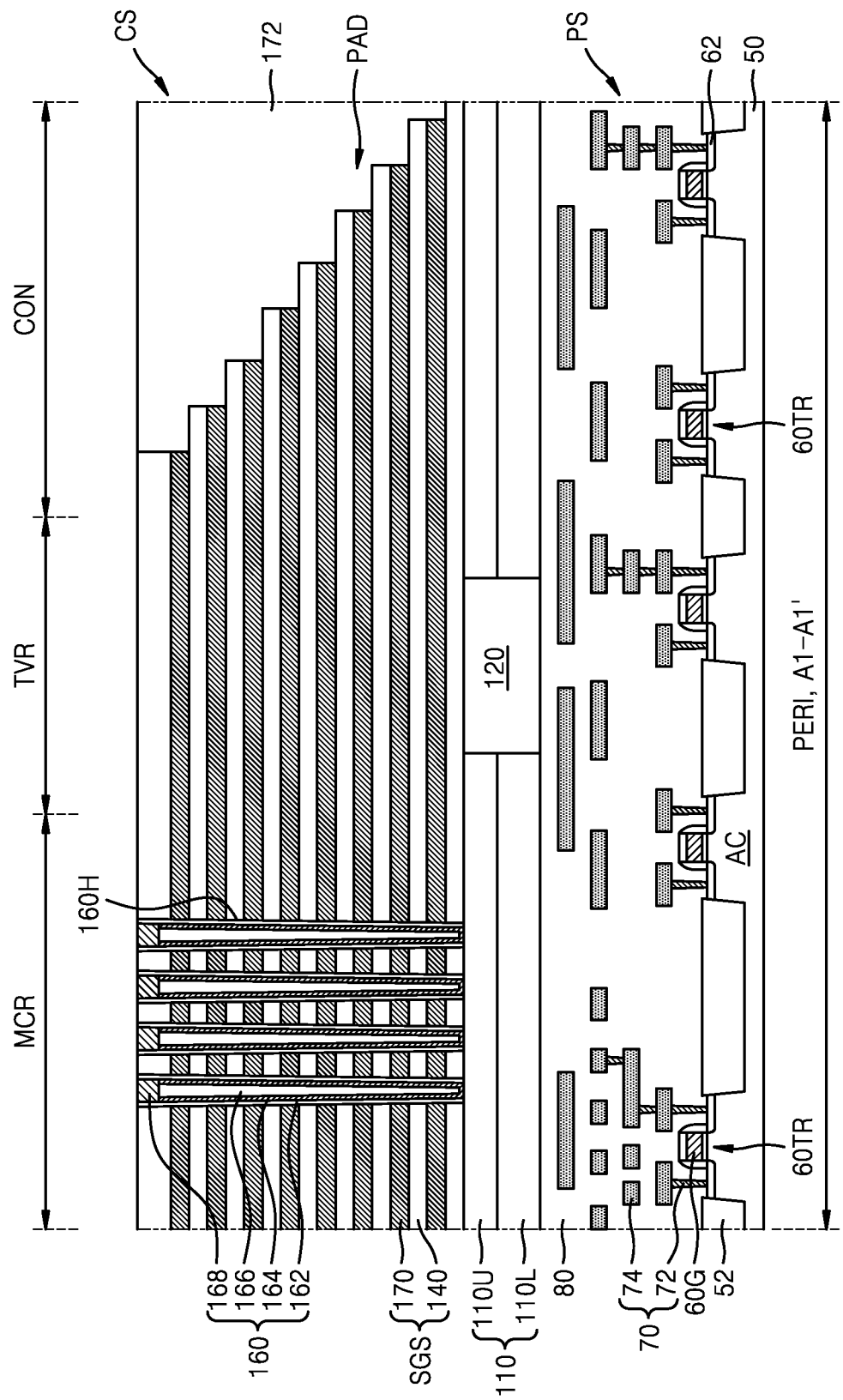

Referring to FIGS. 16A and 16B, a mask pattern may be formed on the sacrificial gate stack SGS, and the channel hole 160H may be formed by patterning the sacrificial gate stack SGS using the mask pattern as an etching mask.

The channel structure 160 including the gate insulation layer 162, the channel layer 164, the buried insulation layer 166, and the conductive plug 168 may be formed on the inner wall of the channel hole 160H.

In a process of forming the channel structure 160, a dummy channel structure passing through the pad portion PAD may be formed together in the connection region CON.

Figure 17A:
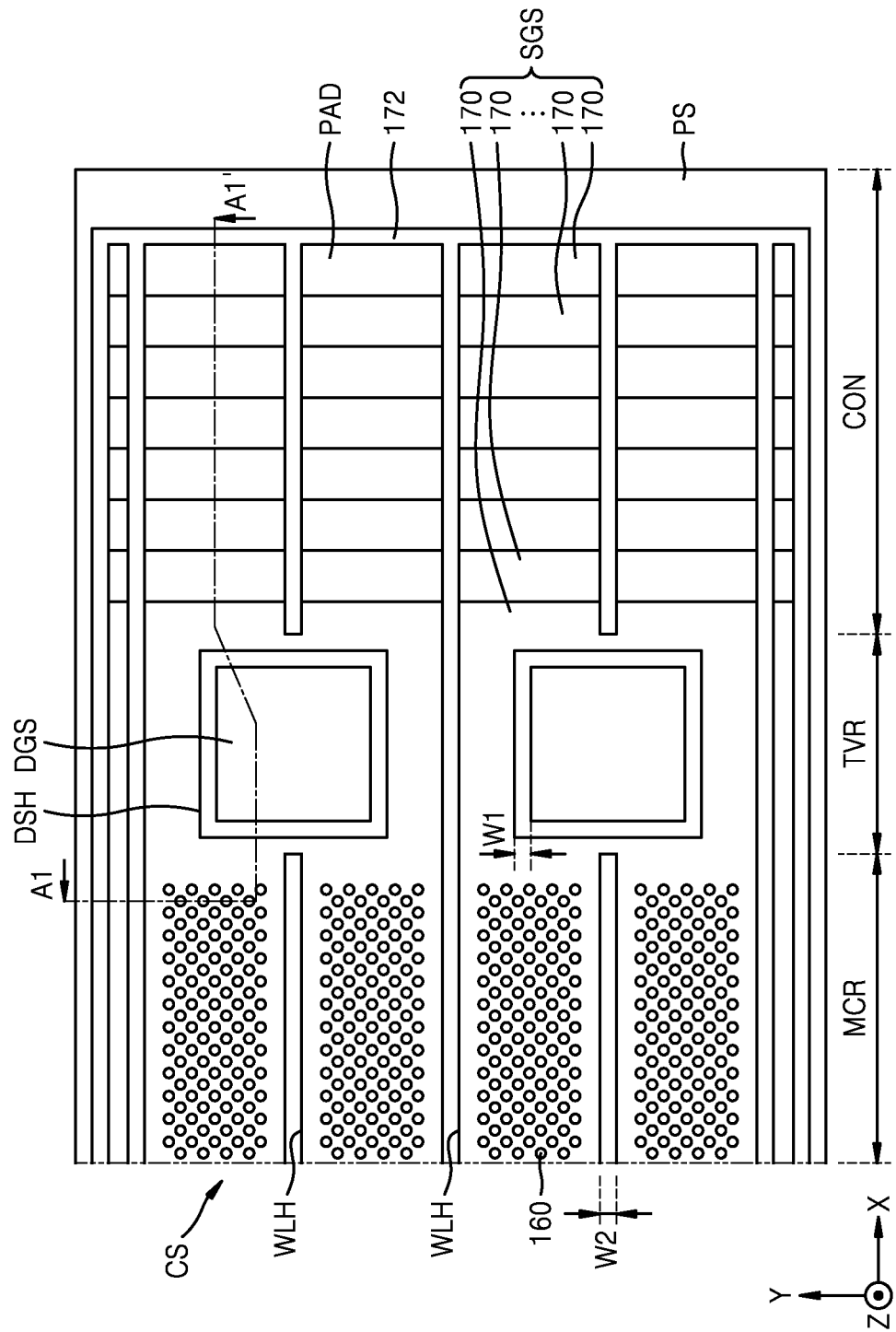
Figure 17B:
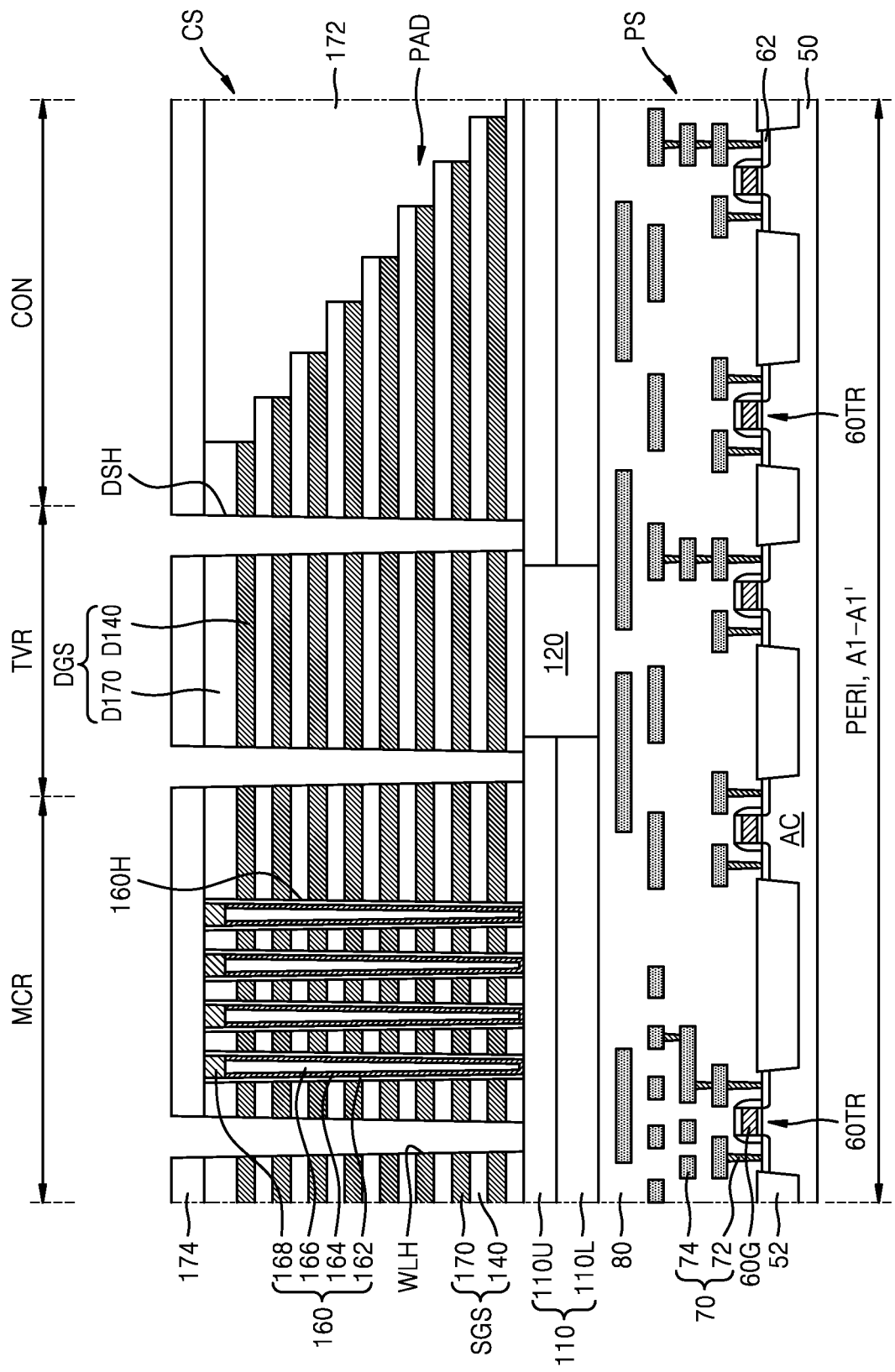

Referring to FIGS. 17A and 17B, the upper insulation layer 174 may be formed on the sacrificial gate stack SGS and the cover insulation layer 172. Thereafter, the mask pattern may be formed on the upper insulation layer 174, and a part of the sacrificial gate stack SGS may be removed using the mask pattern as an etching mask to form the gate stack separation opening portion WLH and the dam opening portion DSH.

In exemplary embodiments of the inventive concept, the dam opening portion DSH may have the first width W1 in the second horizontal direction Y, and the gate stack separation opening portion WLH may have the second width W2, which is substantially the same as the first width W1, in the second horizontal direction Y. The gate stack separation opening portion WLH and the dam opening portion DSH may be spaced apart from each other.

The gate stack separation opening portion WLH and the dam opening portion DSH may completely pass through the sacrificial gate stack SGS, such that the top surface of the base structure 110 may be exposed in the gate stack separation opening portion WLH and the bottom portion of the dam opening portion DSH. As the dam opening portion DSH is formed in the form of a closed curve or a ring in the plan view, a part of the sacrificial gate stack SGS surrounded by the dam opening portion DSH may be spaced apart from the other sacrificial gate stack SGS, in which the part of the sacrificial gate stack SGS surrounded by the dam opening portion DSH may be referred to as the mold gate stack DGS.

Referring to FIGS. 18A and 18B, the insulation liner layer L10 and the insulation spacer layer L20 may be sequentially formed on the gate stack separation opening portion WLH and the inner wall of the dam opening portion DSH.

In exemplary embodiments of the inventive concept, the insulation liner layer L10 may be formed using a material having excellent step coverage. The insulation spacer layer L20 may be formed using a material having a poor step coverage or a material having an etching selectivity with respect to the insulation liner layer L10. In an exemplary embodiment, the insulation spacer layer L20 may be formed using a material having less step coverage than the material used to form the insulation liner layer L10.

The insulation spacer layer L20 may be formed to a relatively large thickness in an inlet of an upper side of the gate stack separation opening portion WLH and an inlet of the upper side of the dam opening portion DSH, thus forming the overhang portion L20T.

Figure 19A:
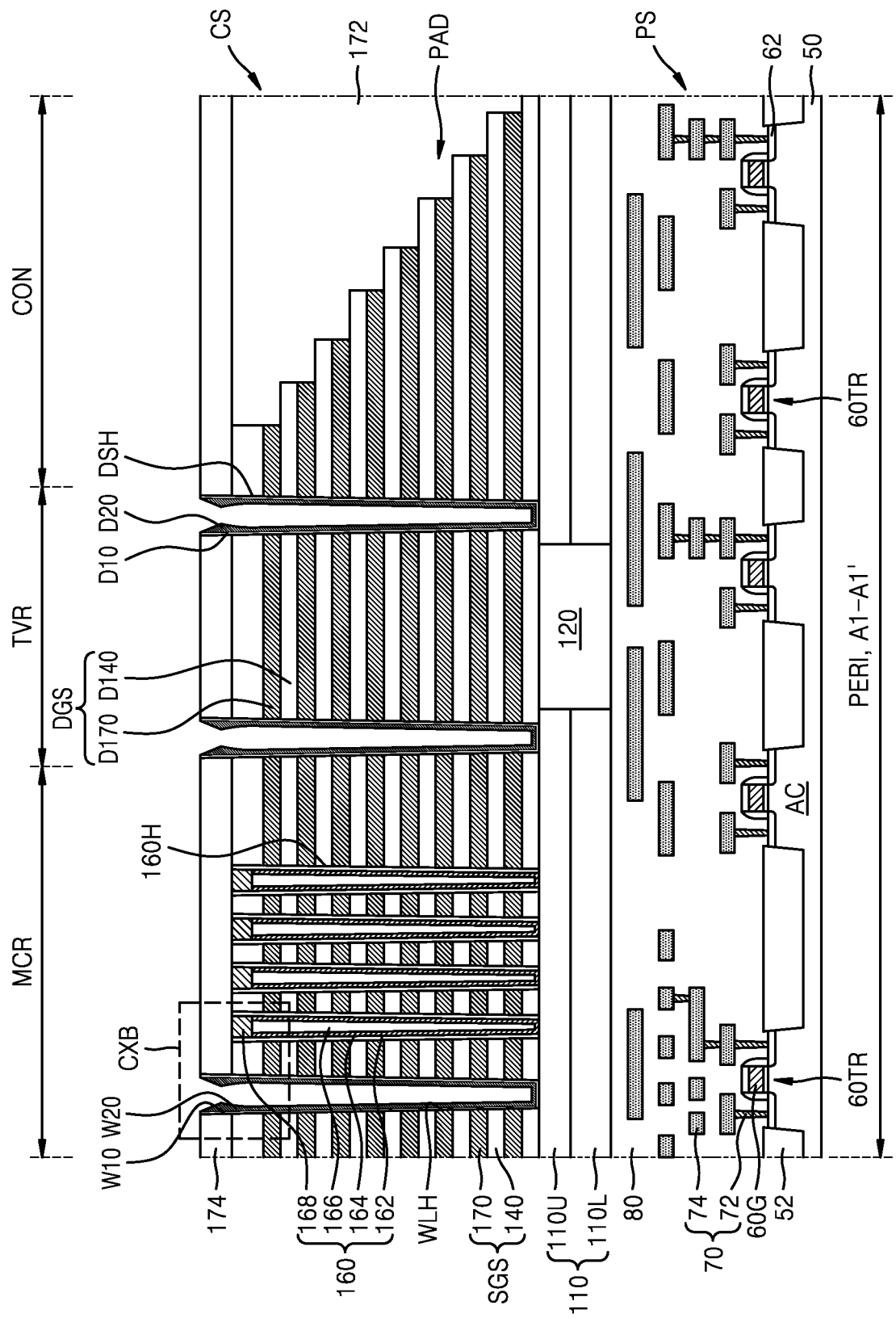
Figure 19B:
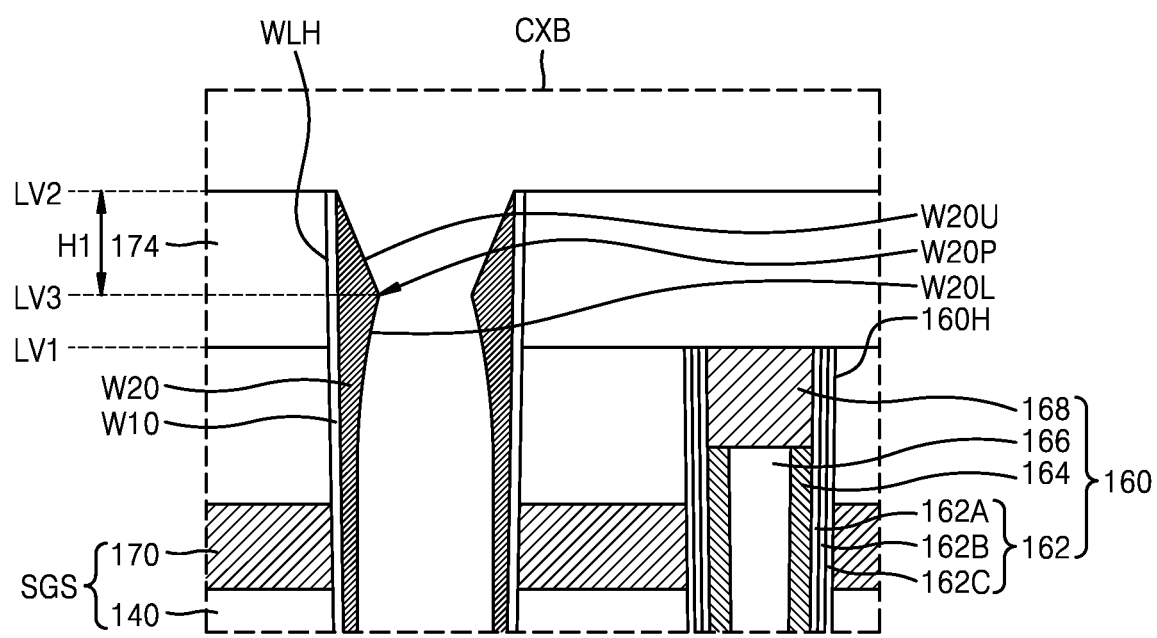

Referring to FIGS. 19A and 19B, by chamfering the overhang portion L20T of the insulation spacer layer L20, the inlet of the upper side of the gate stack separation opening portion WLH and the inlet of the upper side of the dam opening portion DSH may expand.

In exemplary embodiments of the inventive concept, a process of chamfering the overhang portion L20T may be, for example, a dry etching process or an anisotropic etching process. In the process of chamfering the overhang portion L20T, the insulation spacer layer L20 and the insulation liner layer L10, which are arranged on the upper insulation layer 174, may be removed together, such that the top surface of the upper insulation layer 174 may be exposed again.

After the chamfering process, an insulation liner W10 and an insulation spacer W20 may be arranged on the inner wall of the gate stack separation opening portion WLH, and the insulation liner D10 and the insulation spacer D20 may be arranged on the inner wall of the dam opening portion DSH.

As the overhand portion L20T of the insulation spacer layer L20 is removed by the chamfering process, the pair of sloped sidewalls W20U may be formed at the upper side of the gate stack separation opening portion WLH and the pair of sloped sidewalls D20U (see FIG. 6) may be formed at the upper side of the dam opening portion DSH. For example, the insulation spacer W20 may include the protrusion portion W20P having the largest horizontal width at the upper side of the insulation spacer W20, the pair of main sidewalls W20L arranged at the lower vertical level than the protrusion portion W20P, and the pair of sloped sidewalls W20U arranged at the higher vertical level than the protrusion portion W20P. The pair of sloped sidewalls W20U and D20U may have a positive slope, e.g., the pair of sloped sidewalls D20U facing each other may be inclined in a direction away from each other toward the upper side of the dam opening portion DSH, and the pair of sloped sidewalls W20U facing each other may be inclined in a direction away from each other toward the upper side of the gate stack separation opening portion WLH.

Figure 20A:
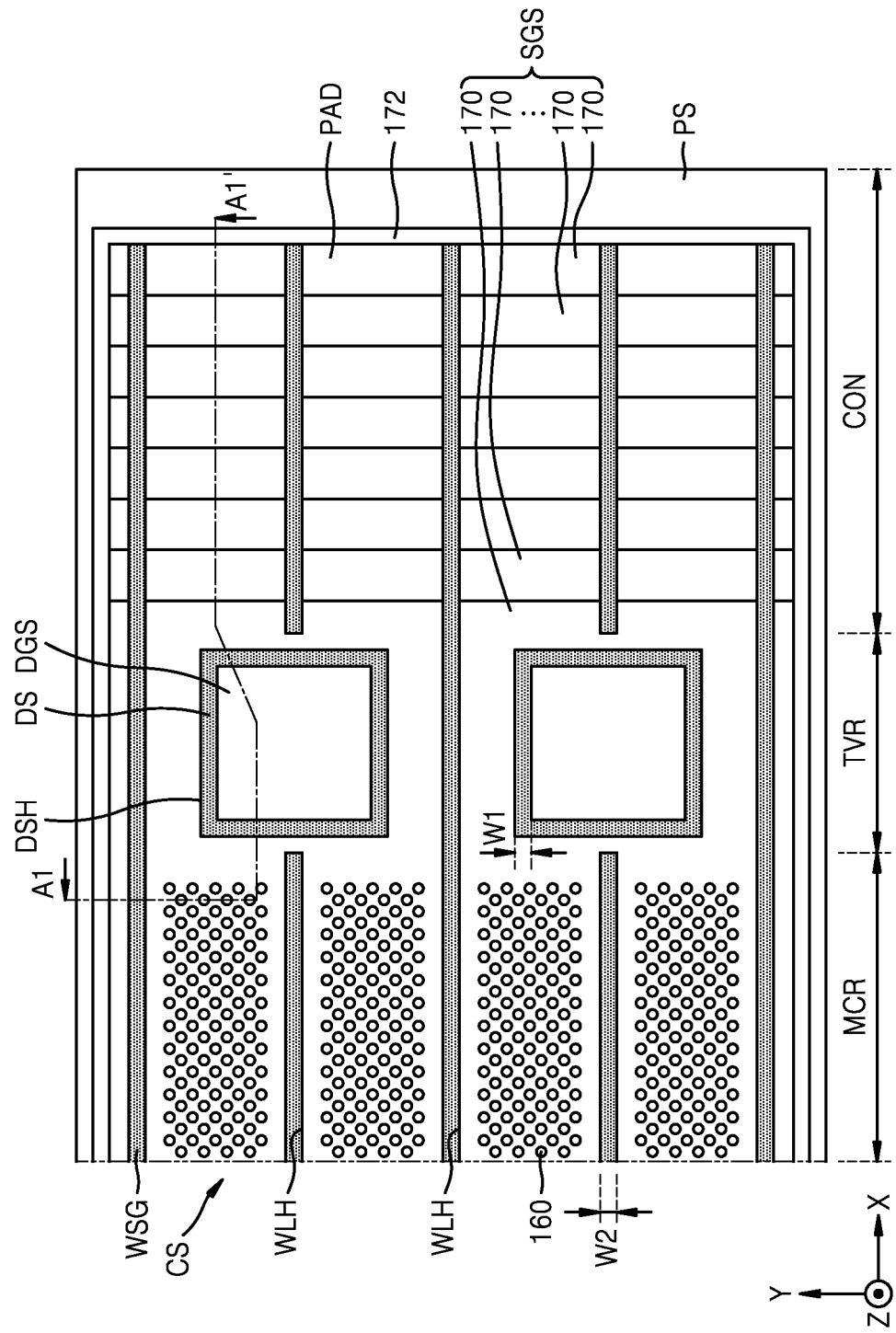
Figure 20B:
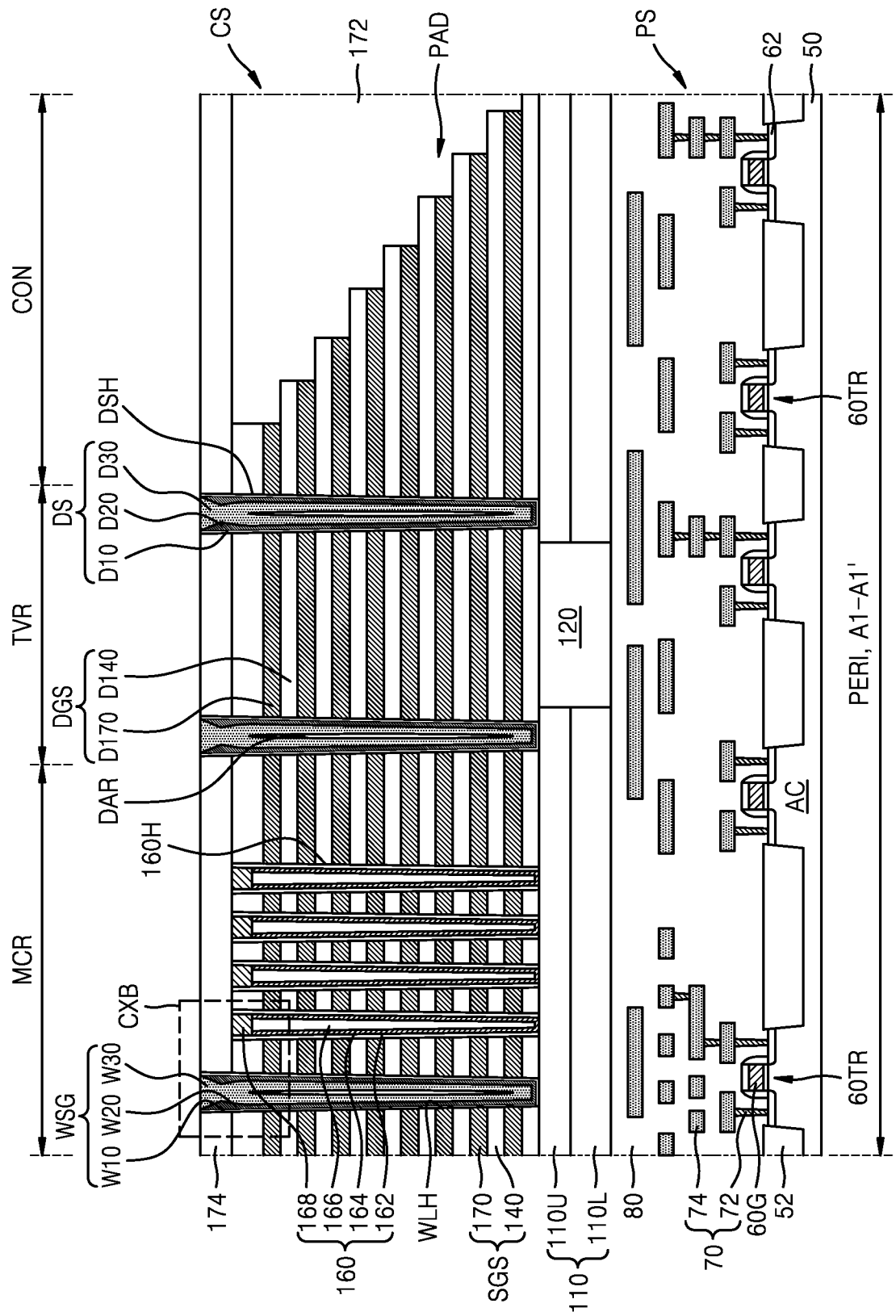
Figure 20C:
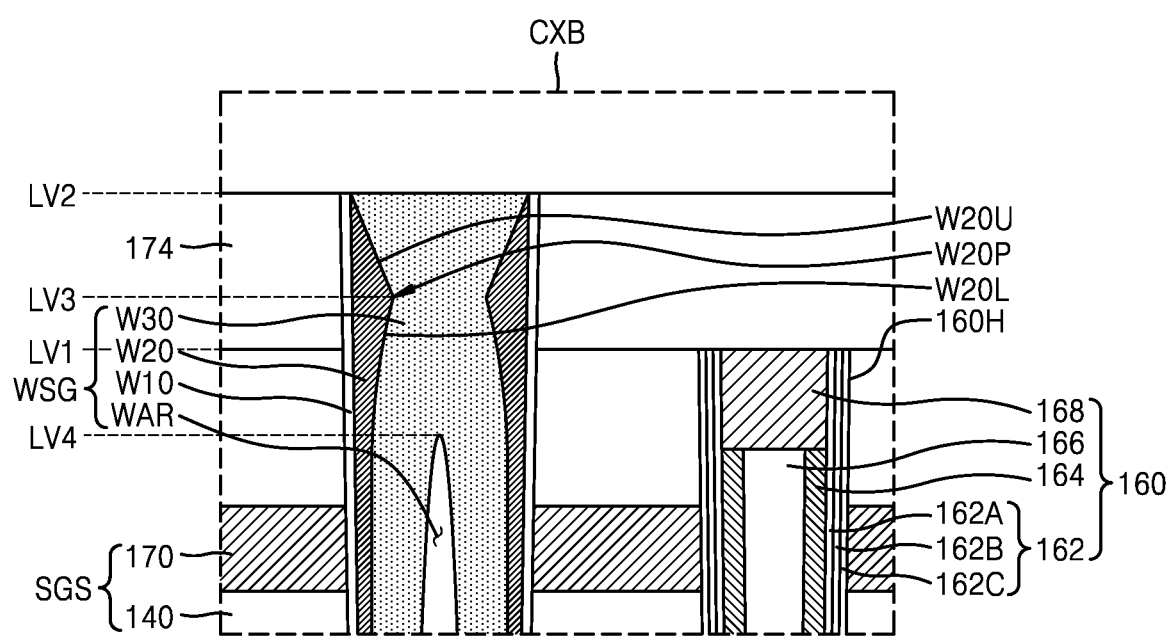

Referring to FIGS. 20A through 20C, the buried layers W30 and D30 including the air spaces WAR and DAR may be formed on the gate stack separation opening portion WLH and the inner wall of the dam opening portion DSH. In exemplary embodiments of the inventive concept, after a polysilicon material layer that fills the gate stack separation opening portion WLH and the dam opening portion DSH is formed, a part of the polysilicon material layer formed on the upper insulation layer 174 may be removed by planarization and the part of the polysilicon material layer may be left only inside the gate stack separation opening portion WLH and the dam opening portion DSH, thus forming the buried layers W30 and D30.

In a process of forming the polysilicon material layer, the polysilicon material layer may clog the inlet of the gate stack separation opening portion WLH and the inlet of the dam opening portion DSH without completely filling the inside of the gate stack separation opening portion WLH and the inside of the dam opening portion DSH, such that the air spaces WAR and DAR may be formed inside the gate stack separation opening portion WLH and the dam opening portion DSH.

As shown in FIG. 20C, the pair of sloped sidewalls W20 and D20 have a positive slope and the inlet of the gate stack separation opening portion WLH and the inlet of the dam opening portion DSH may have relatively large widths. Thus, in the process of forming the buried layers W30 and D30, the air spaces WAR and DAR may have top surfaces arranged at a lower level, and in exemplary embodiments, the air spaces WAR and DAR are not arranged between the pair of sloped sidewalls W20 and D20. As a result, in planarization of the polysilicon material layer, the air spaces WAR and DAR are not exposed to an etching atmosphere.

Herein, the insulation liner W10, the insulation spacer W20, and the buried layer W30 formed inside the gate stack separation opening portion WLH may be referred to as the sacrificial buried structure WSG. Herein, the insulation liner W10, the insulation spacer W20, and the buried layer W30 formed inside the gate stack separation opening portion WLH may be removed in a subsequent process, and thus, may be referred to as a sacrificial insulation liner, a sacrificial insulation spacer, and a sacrificial buried layer, respectively. The insulation liner D10, the insulation spacer D20, and the buried layer D30 formed inside the dam opening portion DHS may be referred to as the dam structure DS. According to exemplary embodiments of the inventive concept, the dam opening portion DSH and the gate stack separation opening portion WLH may be formed at substantially the same time, the sacrificial insulation spacer and the insulation spacer D20 may be formed at substantially the same time, and the sacrificial buried layer and the buried layer D30 may be formed at substantially the same time.

Figure 21A:
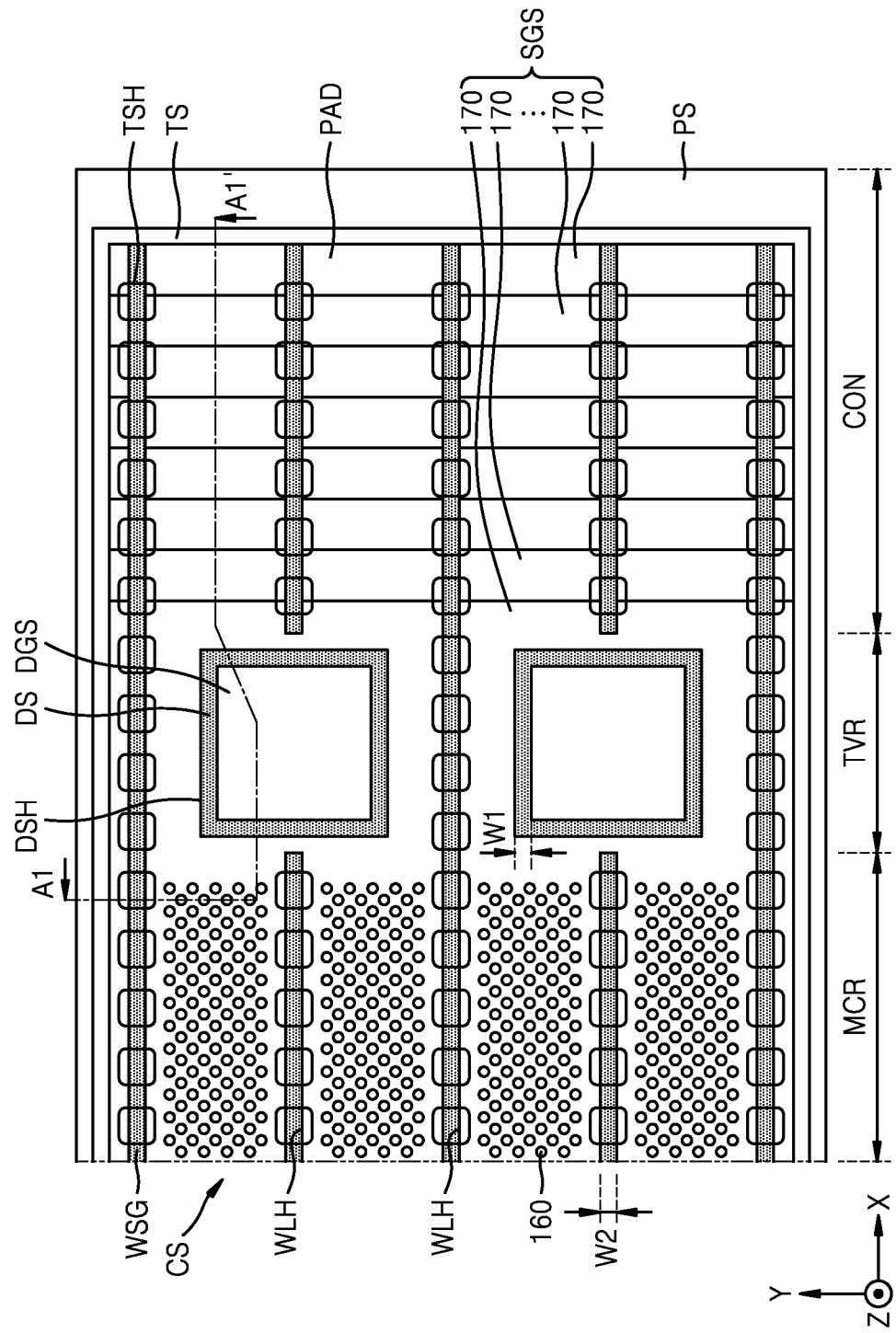
Figure 21B:
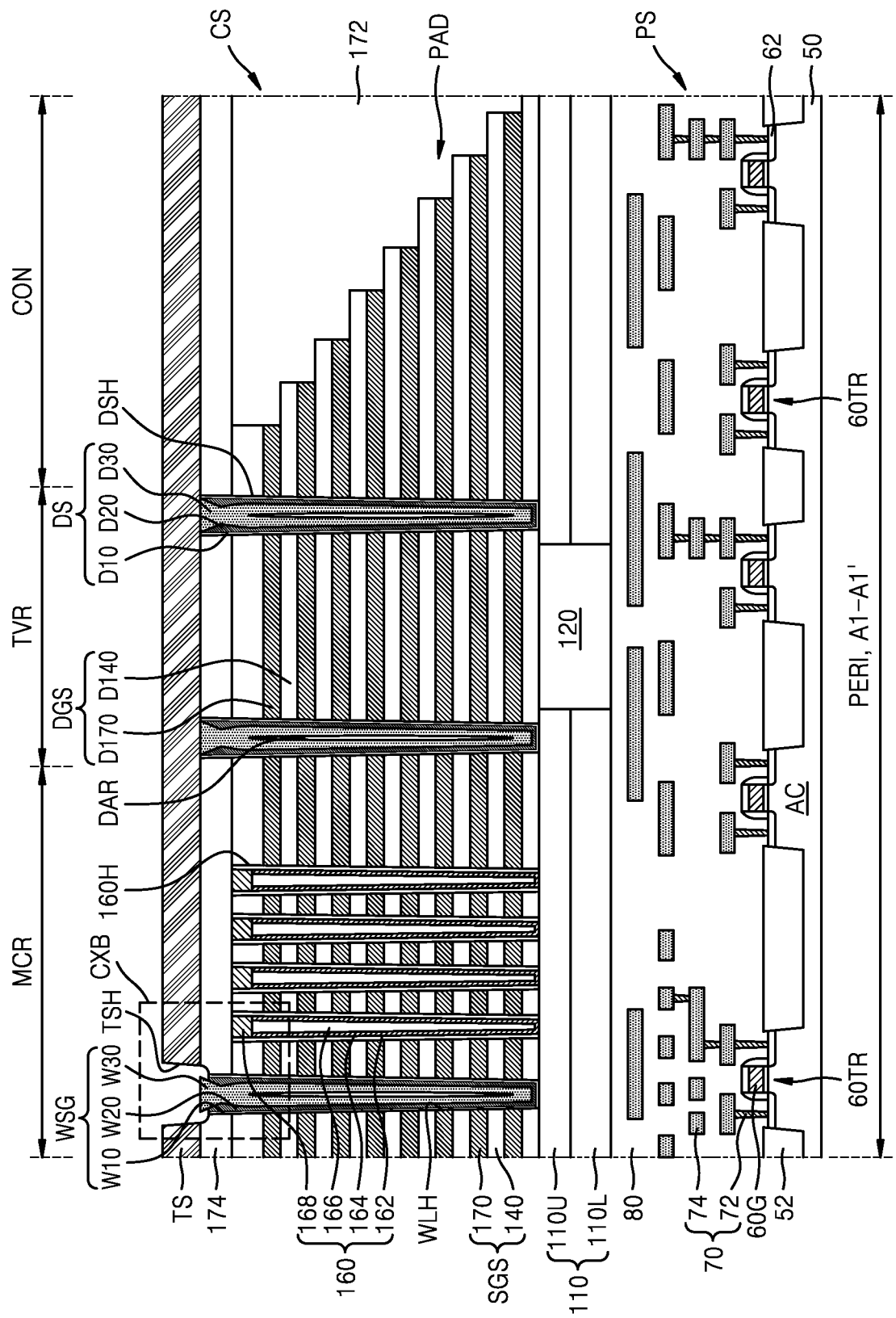
Figure 21C:
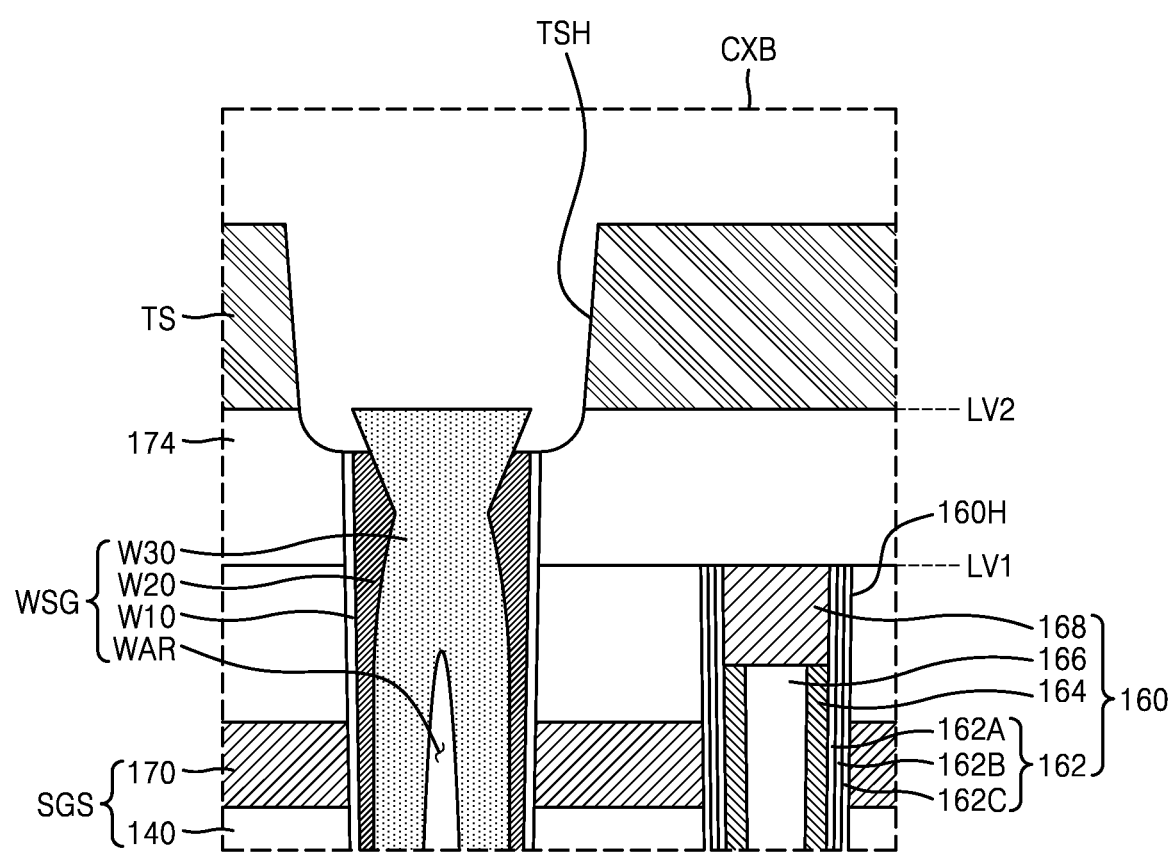

Referring to FIGS. 21A through 21C, the upper support layer TS including a plurality of opening portions TSH may be formed on the upper insulation layer 174, the sacrificial buried structure WSG, and the dam structure DS. In the process of forming the plurality of opening portions TSH, a part of the upper insulation layer 174 and a part of the insulation liner D10 and the insulation spacer D20, which are arranged under the plurality of opening portions TSH, may be removed together.

In the plan view, the plurality of opening portions TSH may be arranged in the first horizontal direction X to vertically overlap the gate stack separation opening portion WLH. In exemplary embodiments, the plurality of opening portions TSH does not overlap the dam structure DS and a part of the mold gate stack DGS surrounded by the dam structure DS, such that the dam structure DS and the mold gate stack DGS may be covered by the upper support layer TS.

Figure 22A:
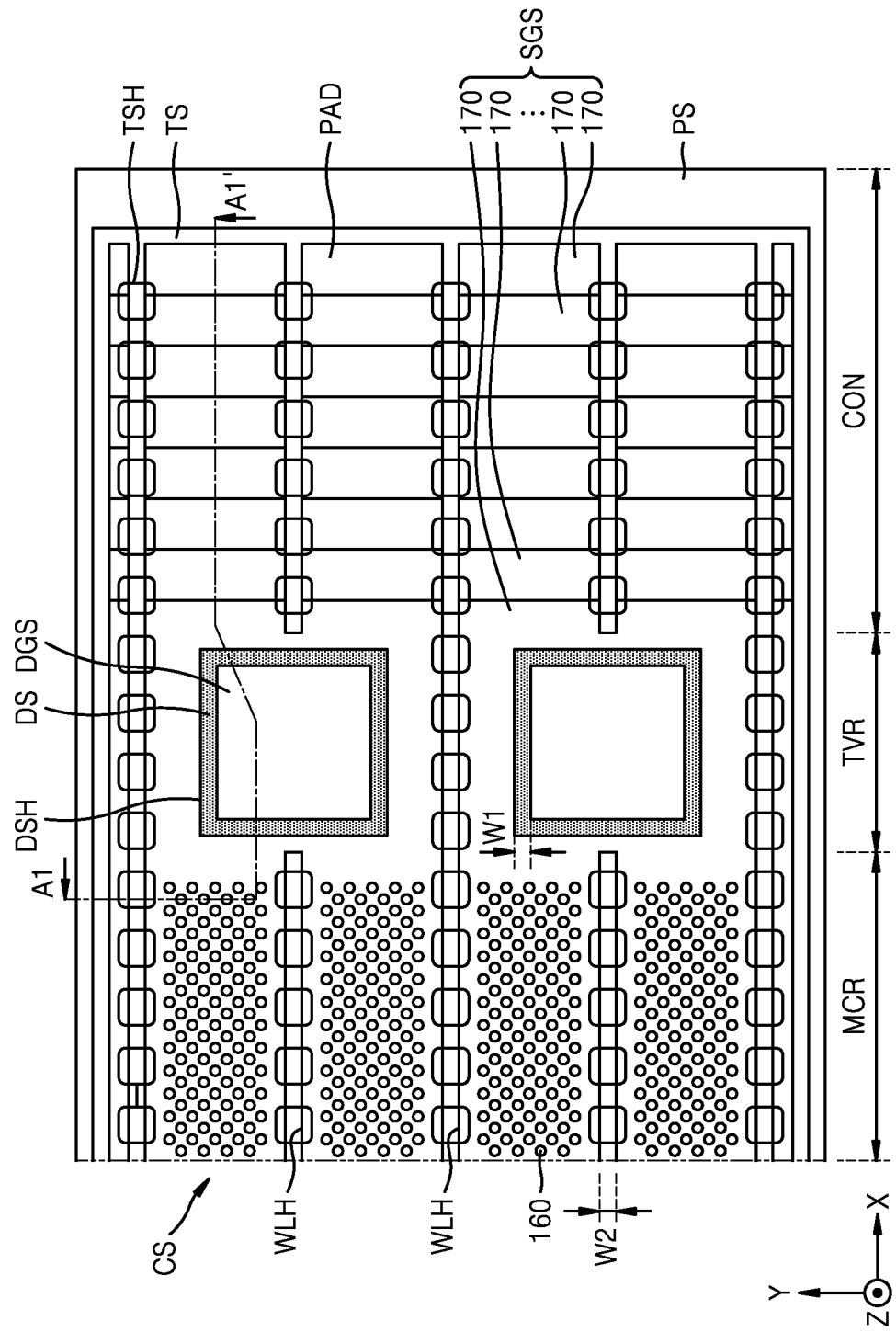
Figure 22B:
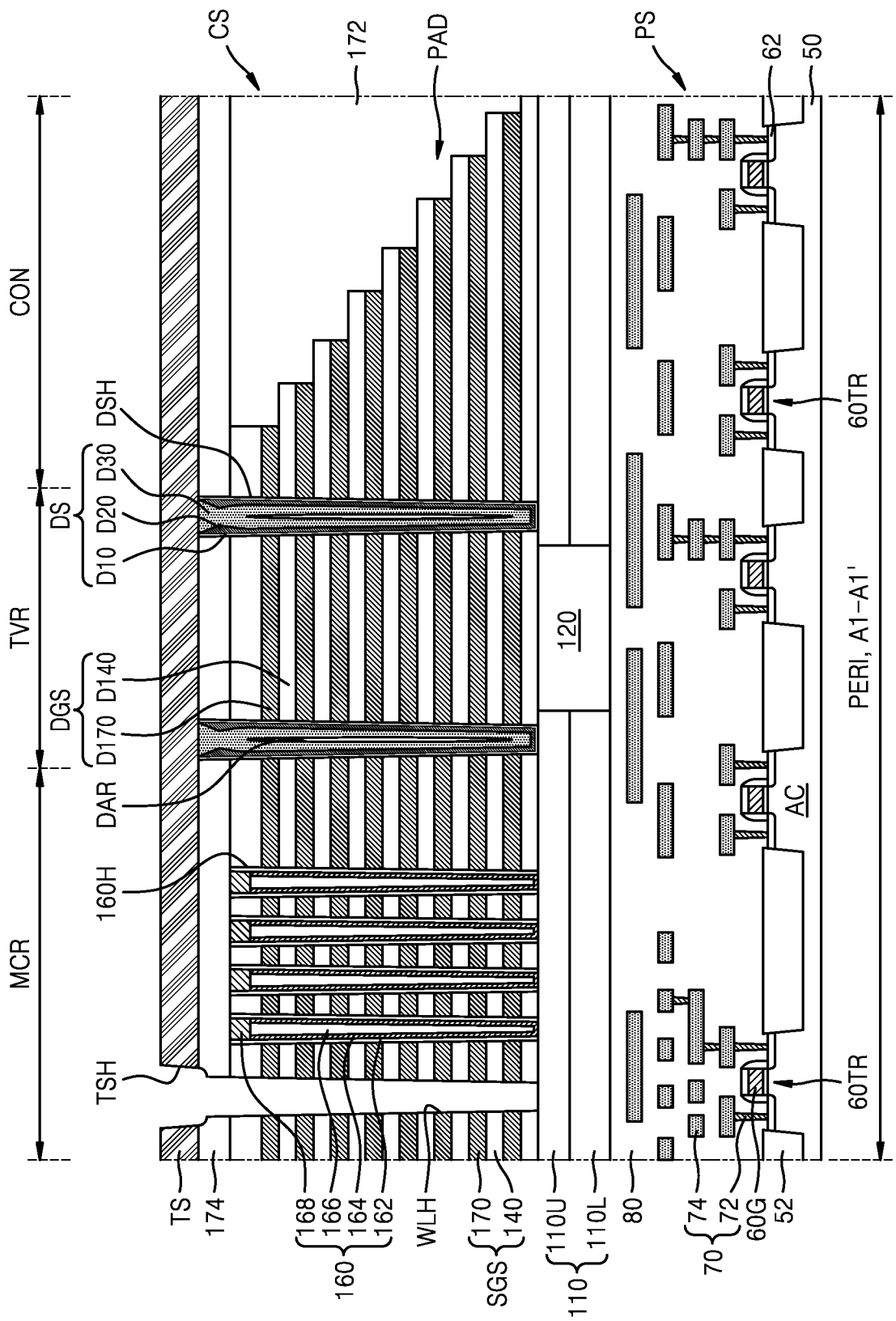

Referring to FIGS. 22A and 22B, the sacrificial buried structure WSG exposed through the plurality of opening portions TSH may be removed.

In exemplary embodiments of the inventive concept, a process of removing the sacrificial buried structure WSG may include a plurality of wet etching processes for removing the buried layer W30, the insulation spacer W20, and the insulation liner W10, respectively. For example, the process of removing the sacrificial buried structure WSG, as well as removing the sacrificial insulation spacer, may be a wet etching process that uses an etching condition for obtaining isotropic etching. As a result of removing the sacrificial buried structure WSG, the plurality of first mold layers 170 may be exposed on the inner wall of the gate stack separation opening portion WLH.

As the dam structure DS is covered by the upper support layer TS without being exposed through the plurality of opening portions TSH, in exemplary embodiments, the dam structure DS is not exposed to the etching atmosphere in the process of removing the sacrificial buried structure WSG. That is, the dam structure DS may remain without being removed.

Figure 23A:
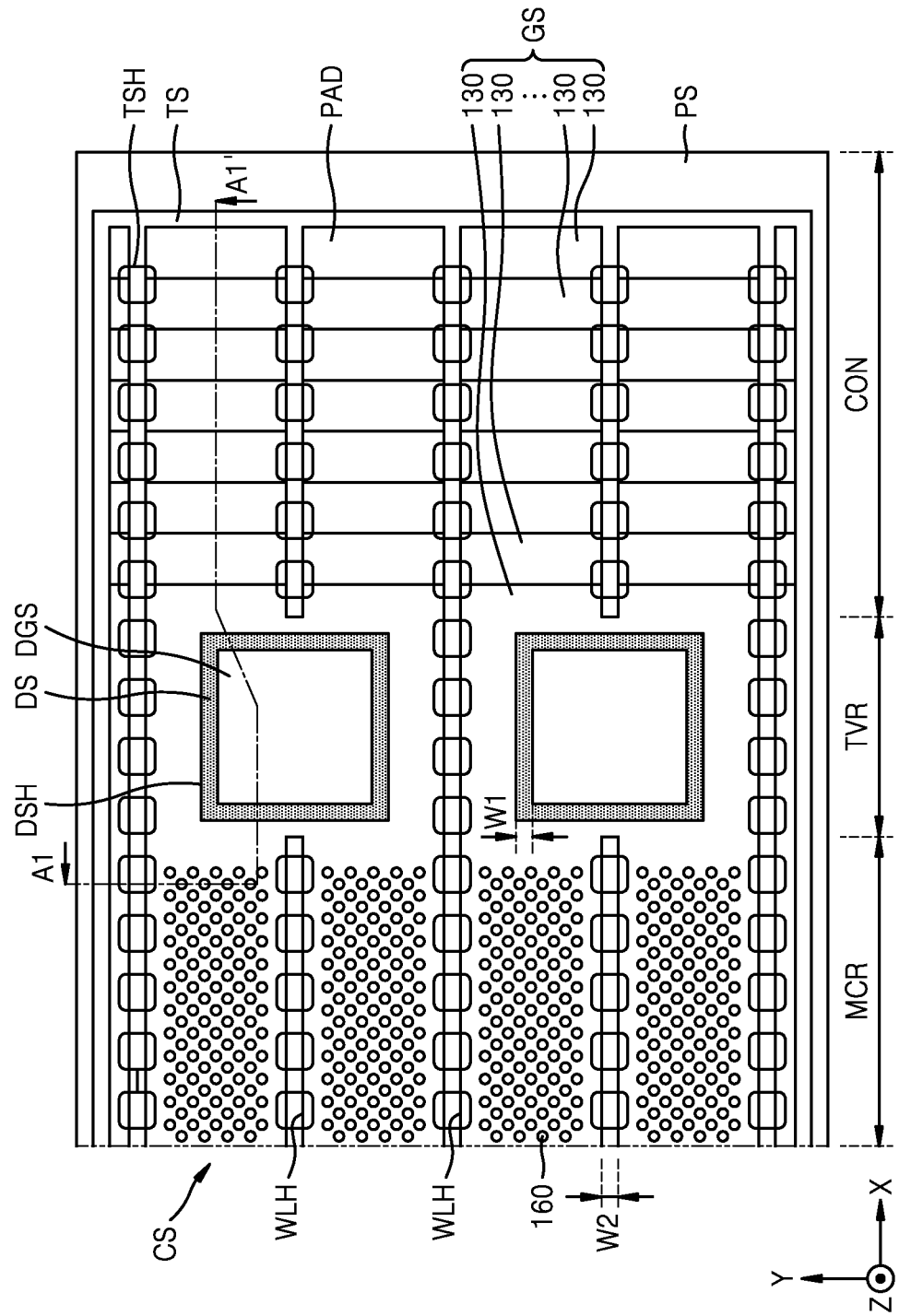

Referring to FIGS. 23A and 23B, by removing the plurality of first mold layers 170 exposed at the sidewall of the gate stack separation opening portion WLH, a conductive material may be buried in a position where the first mold layer 170 is removed, thus forming the first gate electrode 130. In exemplary embodiments of the inventive concept, the process of removing the first mold layer 170 may be a wet etching process using a phosphoric acid solution as an etchant.

The dam structure DS may be covered by the upper support layer TS without being exposed through the plurality of opening portions TSH, such that, in exemplary embodiments, the mold layer D170 in the mold gate stack DGS is not exposed to the etching atmosphere in the process of removing the plurality of first mold layers 170, and may remain without being removed. Thus, in exemplary embodiments, the mold layer D170 is not replaced with the plurality of first gate electrodes 130.

Figure 24A:
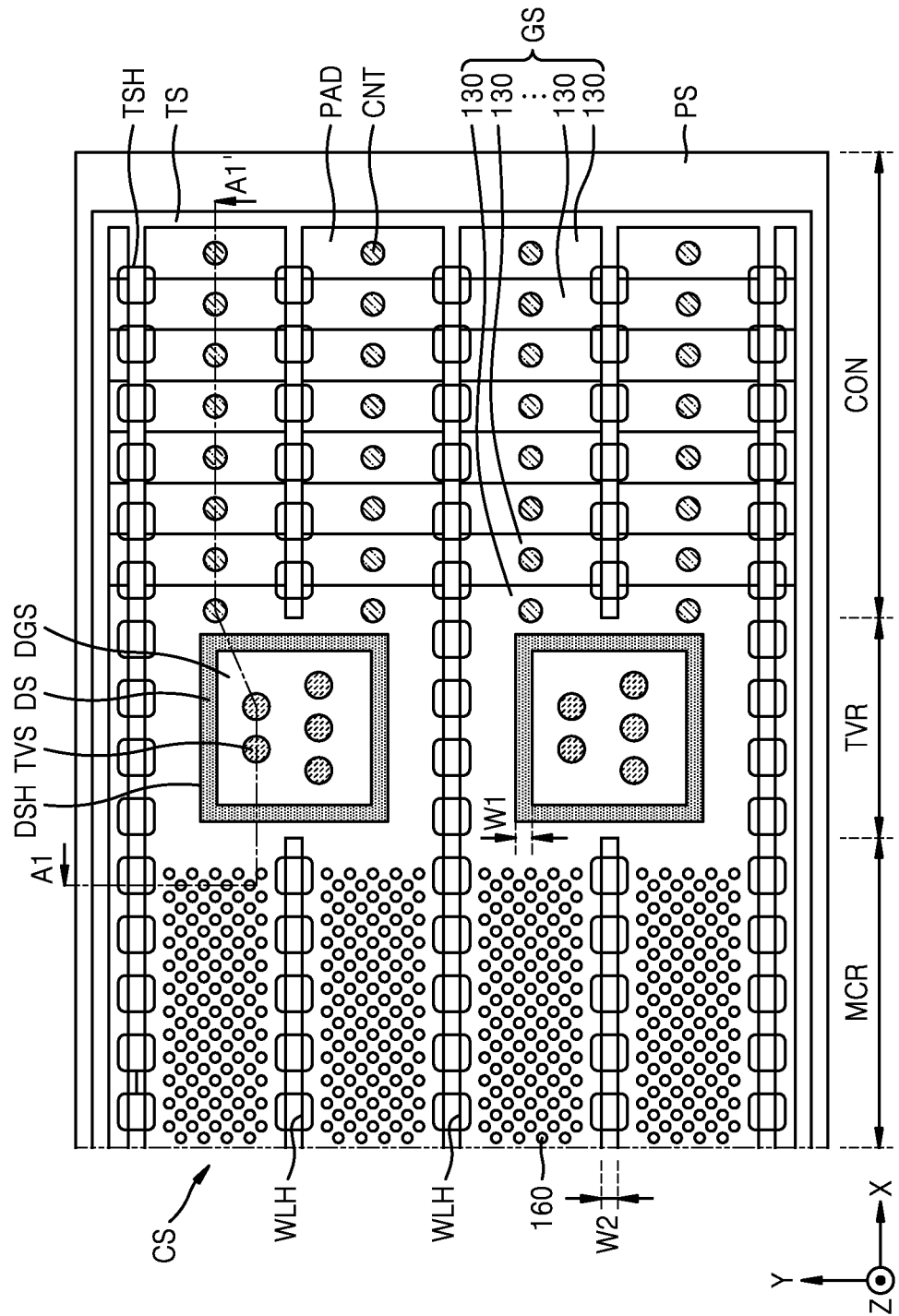
Figure 24B:
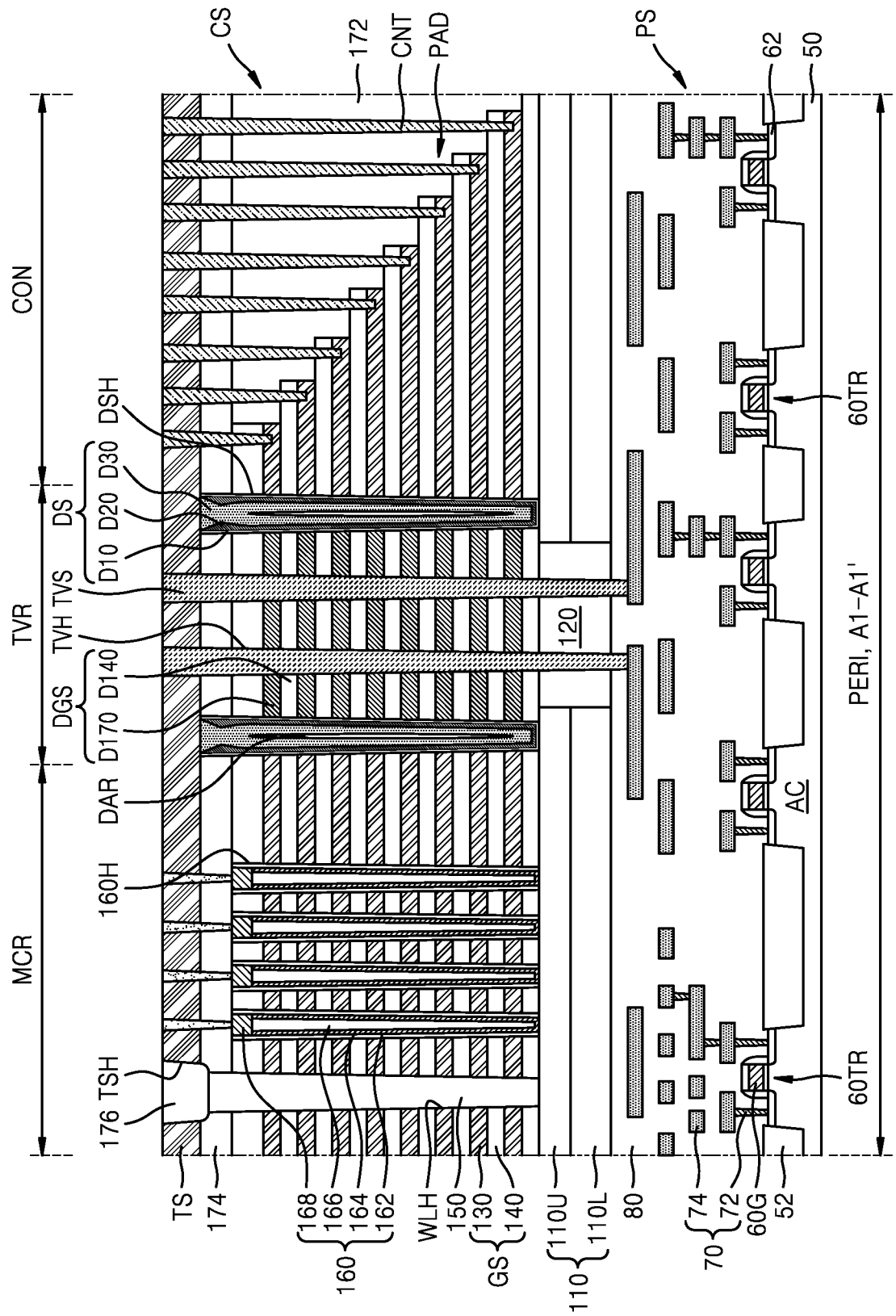

Referring to FIGS. 24A and 24B, the gate stack separation insulation layer 150 may be formed by filling an insulation material in the gate stack separation opening portion WLH, and the upper buried layer 176 may be formed by filling an insulation material in the opening portion TSH. In exemplary embodiments of the inventive concept, the upper buried layer 176 may be formed of the same material in the same process as the gate stack separation insulation layer 150, and in this case, the upper buried layer 176 may be formed integrally with the gate stack separation insulation layer 150 and a boundary between the upper buried layer 176 and the gate stack separation insulation layer 150 may not be detectable.

The pad contact CNT may be electrically connected with the pad portion PAD through the upper support layer TS, the upper insulation layer 174, and the cover insulation layer 172. Thereafter, a bit line contact BLC may be electrically connected to the channel structure 160 through the upper support layer TS and the upper insulation layer 174. The through electrode TVS may be electrically connected with the peripheral circuit line structure 70 through the upper support layer TS, the upper insulation layer 174, the mold gate stack DGS, and the base insulation layer 120.

Referring back to FIG. 5, the bit line BL may be electrically connected to the bit line contact BLC on the upper support layer TS, and the conductive line ML may be electrically connected to the through electrode TVS and the pad contact CNT.

The above-described processes may be performed to complete the integrated circuit device 100.

According to exemplary embodiments of the inventive concept, by chamfering the overhang portion L20T at the upper side of the insulation spacer layer L20, the pair of sloped sidewalls W20U and D20U having a positive slope may be formed. Thus, in a process of filling the buried layers W30 and D30, the air spaces WAR and DAR may be formed at a lower vertical level (e.g., the fourth vertical level LV4) than the pair of sloped sidewalls W20U and D20U. Thus, in planarization of the buried layers W30 and D30, the air spaces WAR and DAR are not exposed to the atmosphere outside the buried layers W30 and D30, and an insulation material may not permeate the inside of the air spaces WAR and DAR.

In exemplary embodiments of the inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an exemplary embodiment of the inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the inventive concept has been particularly shown and described with reference to the exemplary embodiments thereof, it will be understood that various changes in form and detail may be made therein without departing from the spirit and scope of the inventive concept as defined by the following claims.

What is claimed is:

1. An integrated circuit device, comprising:
a peripheral circuit structure arranged on a substrate;
a gate stack arranged on the peripheral circuit structure, wherein the gate stack comprises a plurality of gate electrodes spaced apart from each other in a first direction substantially perpendicular to a top surface of the substrate;
a dam structure formed in a dam opening portion that passes through the gate stack,
wherein the dam structure comprises:
an insulation spacer arranged on an inner wall of the dam opening portion and comprising a pair of sloped sidewalls at an upper side of the dam opening portion; and
a buried layer filling an inside of the dam opening portion and comprising aft one air space completely surrounded by the buried layer and extending through the gate stack in the first direction,
wherein the one air space is adjacent to a gate electrode of the plurality of gate electrodes that is closer to a top of the gate stack than to a bottom of the gate stack, and is adjacent to another gate electrode of the plurality of gate electrodes that is closer to the bottom of the gate stack than to the top of the gate stack;
a mold gate stack surrounded by the dam structure and comprising a plurality of mold layers spaced apart from each other in the first direction;
a plurality of conductive lines arranged on the gate stack, the mold gate stack, and the dam structure; and
a plurality of through electrodes connected to the plurality of conductive lines, extending to the peripheral circuit structure through the mold gate stack, and surrounded by the dam structure.

2. The integrated circuit device of claim 1, wherein sidewalls belonging to the pair of sloped sidewalls are inclined in a direction away from each other toward the upper side of the dam opening portion.

3. The integrated circuit device of claim 2, wherein the buried layer further comprises:
a neck portion at the upper side of the dam opening portion, wherein a distance between the sidewalls belonging to the pair of sloped sidewalls is shortest at a vertical level that is substantially the same as a level of the neck portion.

4. The integrated circuit device of claim 3, wherein the air space is arranged at a level lower than a level of the pair of sloped sidewalls of the insulation spacer, and
the air space is not arranged in a part of the buried layer arranged at a level higher than the level of the neck portion.

5. The integrated circuit device of claim 3, wherein the neck portion of the buried layer has a first height from a top surface of the buried layer in the first direction, and the first height is about 30 nm to about 200 nm.

6. The integrated circuit device of claim 1, wherein the gate stack further comprises:
a gate stack separation opening portion that extends in a second direction that is substantially parallel to the top surface of the substrate,
wherein the dam opening portion is spaced apart from the gate stack separation opening portion, and a width of the gate stack separation opening portion in a third direction that is substantially perpendicular to the second direction is substantially the same as a width of the dam structure in the third direction.

7. The integrated circuit device of claim 6, further comprising:
an upper support layer arranged on the gate stack and comprising a plurality of opening portions vertically overlapping the gate stack separation opening portion,
wherein an entire top surface of the dam structure is covered by the upper support layer.

8. The integrated circuit device of claim 1, wherein the dam structure further comprises:
a first sidewall; and
a second sidewall that is opposite to the first sidewall,
wherein the first sidewall contacts at least one of the plurality of gate electrodes, and the second sidewall contacts at least one of the plurality of mold layers.

9. The integrated circuit device of claim 1, wherein the dam structure further comprises:
an insulation liner arranged on the inner wall of the dam opening portion,
wherein the insulation liner is arranged between the gate stack and the insulation spacer and between the mold gate stack and the insulation spacer.

10. The integrated circuit device of claim 1, wherein the mold gate stack further comprises a plurality of insulation layers arranged between the plurality of mold layers, and the gate stack further comprises a plurality of insulation layers arranged between the plurality of gate electrodes, and
each of the plurality of insulation layers of the mold gate stack is substantially coplanar with a corresponding one of the plurality of insulation layers of the gate stack.

11. The integrated circuit device of claim 10, wherein an uppermost mold layer included in the mold gate stack is arranged at a level lower than a level of an uppermost gate electrode included in the gate stack,
the mold gate stack further comprises a cover insulation layer arranged on the uppermost mold layer, and
the plurality of through electrodes passes through the plurality of insulation layers of the mold gate stack, the plurality of mold layers, and the cover insulation layer.

12. An integrated circuit device, comprising:
a peripheral circuit structure arranged on a substrate;
a gate stack arranged on the peripheral circuit structure, wherein the gate stack comprises:

a plurality of gate electrodes spaced apart from each other in a first direction substantially perpendicular to a top surface of the substrate; and
a gate stack separation opening portion extending in a second direction that is substantially parallel to the top surface of the substrate;
a dam structure formed in a dam opening portion that passes through the gate stack, wherein the dam structure comprises:
an insulation spacer arranged on an inner wall of the dam opening portion and comprising a pair of sloped sidewalls at an upper side of the dam opening portion; and
a buried layer filling an inside of the dam opening portion and comprising a one air space completely surrounded by the buried layer and extending through the gate stack in the first direction,
wherein the one air space is adjacent to a gate electrode of the plurality of gate electrodes that is closer to a top of the gate stack than to a bottom of the gate stack, and is adjacent to another gate electrode of the plurality of gate electrodes that is closer to the bottom of the gate stack than to the top of the gate stack,
wherein the dam opening portion is spaced apart from the gate stack separation opening portion;
a mold gate stack surrounded by the dam structure and comprising a plurality of mold layers spaced apart from each other in the first direction;
an upper support layer arranged on the gate stack and comprising a plurality of opening portions vertically overlapping the gate stack separation opening portion;
a plurality of conductive lines arranged on the upper support layer; and
a plurality of through electrodes connected to the plurality of conductive lines, extending to the peripheral circuit structure through the mold gate stack, and surrounded by the dam structure.

13. The integrated circuit device of claim 12, wherein the buried layer further comprises:
a neck portion at the upper side of the dam opening portion,
wherein a distance between sidewalls belonging to the pair of sloped sidewalls is shortest at a vertical level that is substantially the same as a level of the neck portion.

14. The integrated circuit device of claim 13, wherein the sidewalls belonging to the pair of sloped sidewalls are inclined in a direction away from each other toward the upper side of the dam opening portion.

15. The integrated circuit device of claim 12, wherein an entire top surface of the dam structure is covered by the upper support layer, and
the plurality of through electrodes passes through the upper support layer.

16. An integrated circuit device, comprising:
a peripheral circuit structure arranged on a substrate;
a cell array structure arranged on the peripheral circuit structure,
wherein the cell array structure comprises:
a gate stack comprising a plurality of gate electrodes spaced apart from each other in a first direction substantially perpendicular to a top surface of the substrate, and comprising a gate stack separation opening portion extending in a second direction that is substantially parallel to the top surface of the substrate;

a dam structure formed in a dam opening portion that passes through the gate stack, wherein the dam structure comprises:

an insulation liner arranged on an inner wall of the dam opening portion;

an insulation spacer arranged on the inner wall of the dam opening portion and comprising a pair of sloped sidewalls at an upper side of the dam opening portion; and a buried layer filling an inside of the dam opening portion and comprising aft one air space completely surrounded by the buried layer and extending through the gate stack in the first direction, wherein the one air space is adjacent to a gate electrode of the plurality of gate electrodes that is closer to a top of the gate stack than to a bottom of the gate stack, and is adjacent to another gate electrode of the plurality of gate electrodes that is closer to the bottom of the gate stack than to the top of the gate stack, wherein the dam opening portion is spaced apart from the gate stack separation opening portion;

a mold gate stack surrounded by the dam structure, and comprising a plurality of insulation layers and a plurality of mold layers arranged alternately in the first direction; and an upper support layer arranged on the gate stack and comprising a plurality of opening portions vertically overlapping the gate stack separation opening portion;

a plurality of conductive lines arranged on the cell array structure; and a plurality of through electrodes connected to the plurality of conductive lines, extending to the peripheral circuit structure through the cell array structure, and surrounded by the dam structure, wherein the air space is arranged at a vertical level lower than a level of the pair of sloped sidewalls.

17. The integrated circuit device of claim 16, wherein the dam structure and an entire top surface of the mold gate stack are covered by the upper support layer.

18. The integrated circuit device of claim 16, wherein the buried layer further comprises:

a neck portion at the upper side of the dam opening portion, wherein a distance between sidewalls belonging to the pair of sloped sidewalls is shortest at a vertical level that is substantially the same as a level of the neck portion.

19. The integrated circuit device of claim 18, wherein the neck portion of the buried layer has a first height from a top surface of the buried layer in the first direction, and the first height is about 30 nm to about 200 nm.

20. The integrated circuit device of claim 16, wherein the dam structure further comprises:

a first sidewall; and a second sidewall that is opposite to the first sidewall, wherein the first sidewall contacts at least one of the plurality of gate electrodes, and the second sidewall contacts at least one of the plurality of mold layers, and a width of the gate stack separation opening portion in a third direction that is substantially perpendicular to the second direction is substantially the same as a width of the dam structure in the third direction.

* * * * *